(12) United States Patent
Shirai et al.

(10) Patent No.: US 12,088,292 B2
(45) Date of Patent: Sep. 10, 2024

(54) SEMICONDUCTOR DEVICE

(71) Applicant: SONY SEMICONDUCTOR SOLUTIONS CORPORATION, Kanagawa (JP)

(72) Inventors: Junichiro Shirai, Kanagawa (JP); Hisashi Owa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/996,388

(22) PCT Filed: Mar. 25, 2021

(86) PCT No.: PCT/JP2021/012479
§ 371 (c)(1),
(2) Date: Oct. 17, 2022

(87) PCT Pub. No.: WO2021/220680
PCT Pub. Date: Nov. 4, 2021

(65) Prior Publication Data
US 2023/0216501 A1    Jul. 6, 2023

(30) Foreign Application Priority Data
Apr. 27, 2020 (JP) ................. 2020-078686

(51) Int. Cl.
*H03K 19/0185* (2006.01)
*G05F 1/56* (2006.01)
*H04L 25/02* (2006.01)

(52) U.S. Cl.
CPC ......... *H03K 19/0185* (2013.01); *G05F 1/56* (2013.01); *H04L 25/0272* (2013.01); *H04L 25/028* (2013.01)

(58) Field of Classification Search
None
See application file for complete search history.

(56) References Cited

U.S. PATENT DOCUMENTS

| | | | |
|---|---|---|---|
| 7,486,112 B2* | 2/2009 | Tanaka | H04L 25/0286 327/108 |
| 8,093,907 B2* | 1/2012 | Kojima | G01R 31/31924 324/555 |

(Continued)

FOREIGN PATENT DOCUMENTS

| | | |
|---|---|---|
| JP | 2007-060073 A | 3/2007 |
| JP | 2009-152944 A | 7/2009 |

(Continued)

OTHER PUBLICATIONS

International Search Report and Written Opinion of PCT Application No. PCT/JP2021/012479, issued on Jun. 15, 2021, 12 pages of ISRWO.

*Primary Examiner* — Jeffrey S Zweizig
(74) *Attorney, Agent, or Firm* — CHIP LAW GROUP

(57) ABSTRACT

A semiconductor device according to the present disclosure includes: a first output terminal and a second output terminal; a first driver that has a first positive terminal coupled to the first output terminal and a first negative terminal coupled to the second output terminal, and outputs a differential signal corresponding to a first signal from the first positive terminal and the first negative terminal; and a second driver that has a second positive terminal coupled to the second output terminal and a second negative terminal coupled to the first output terminal, and outputs a differential signal corresponding to the first signal from the second positive terminal and the second negative terminal.

16 Claims, 16 Drawing Sheets

(56) References Cited

U.S. PATENT DOCUMENTS 8,847,632 B2 *   9/2014  Suzuki .................... H03K 5/01
                                                      327/170
9,118,321 B2 *   8/2015  Nishi ............. H03K 19/018528

FOREIGN PATENT DOCUMENTS

| JP | 2013-150182 A | 8/2013 |
| JP | 2014-050087 A | 3/2014 |
| JP | 2016-072653 A | 5/2016 |
| JP | 2016-525302 A | 8/2016 |
| JP | 2019-149773 A | 9/2019 |

* cited by examiner

[FIG. 1]
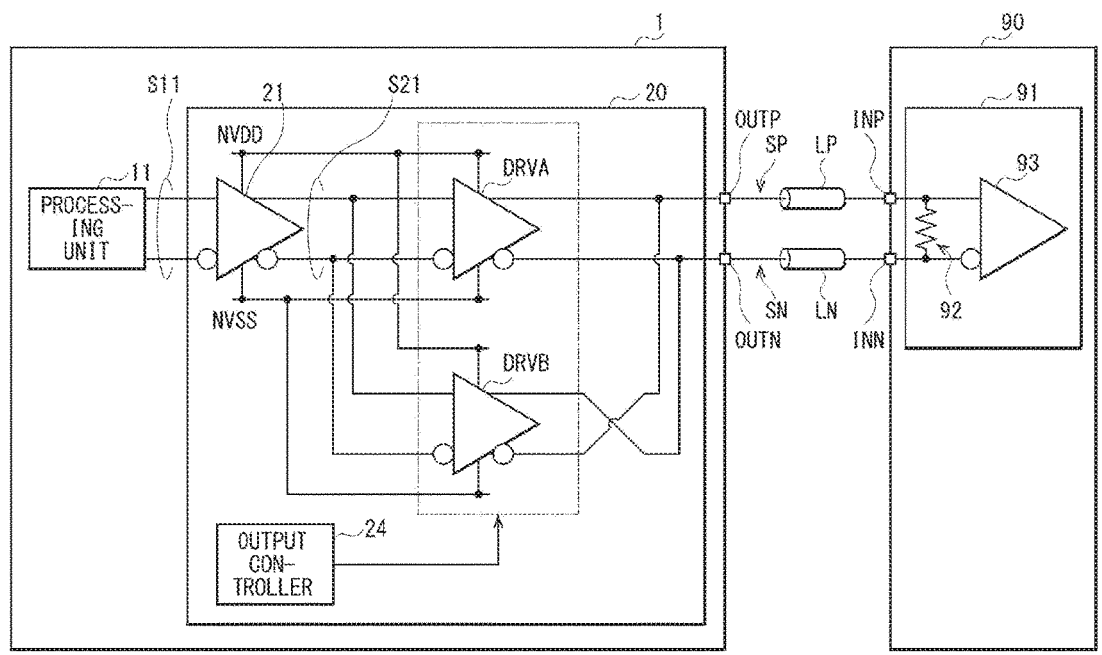

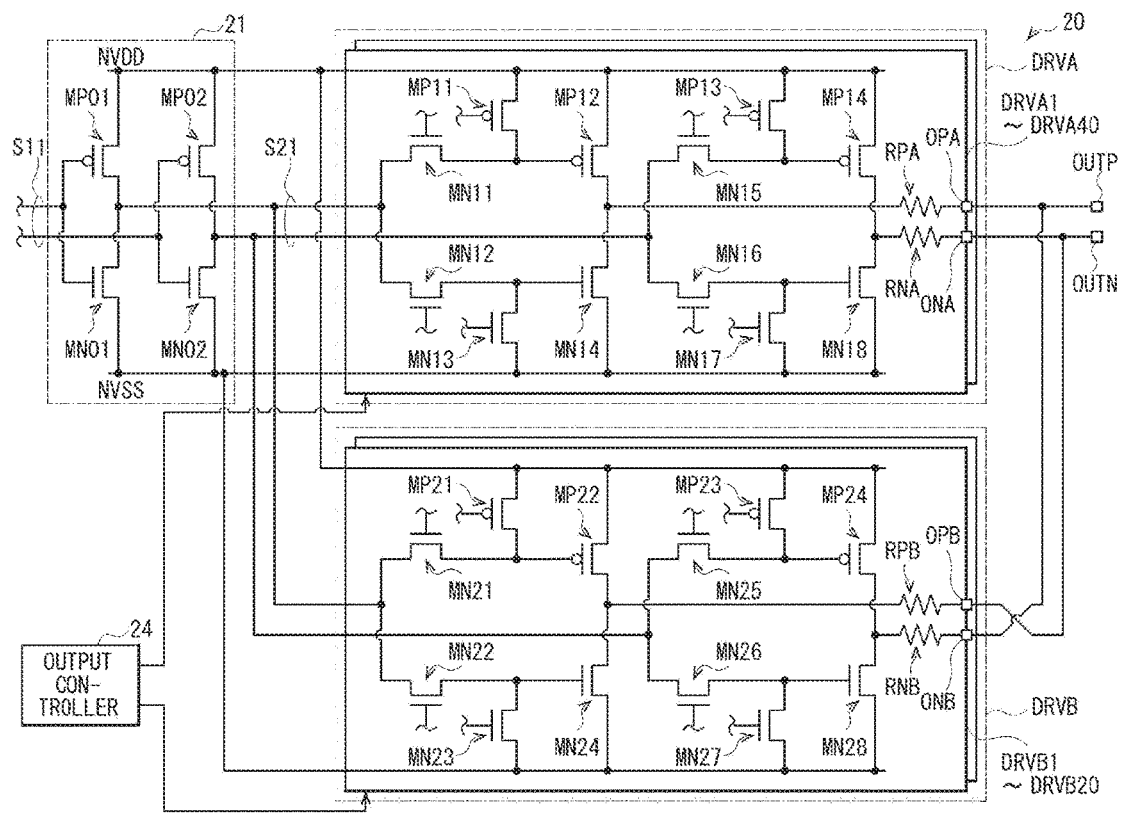
[FIG. 2]

[FIG. 3A]
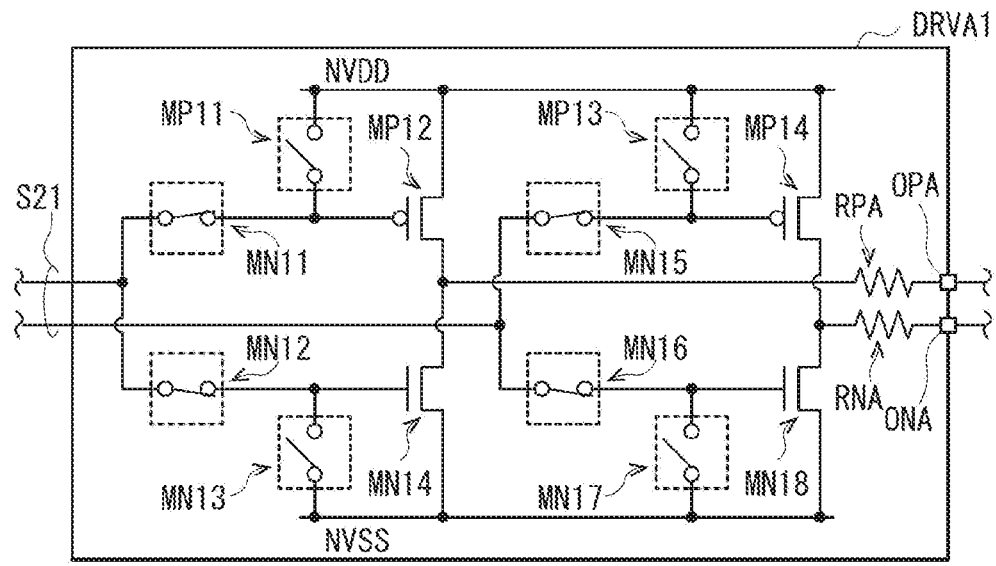
[FIG. 3B]
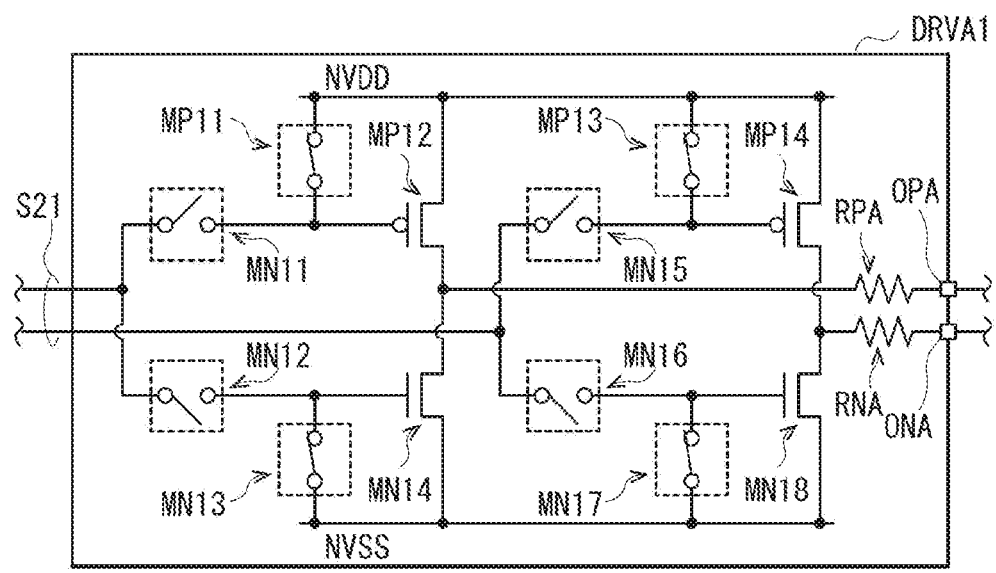

[FIG. 4]
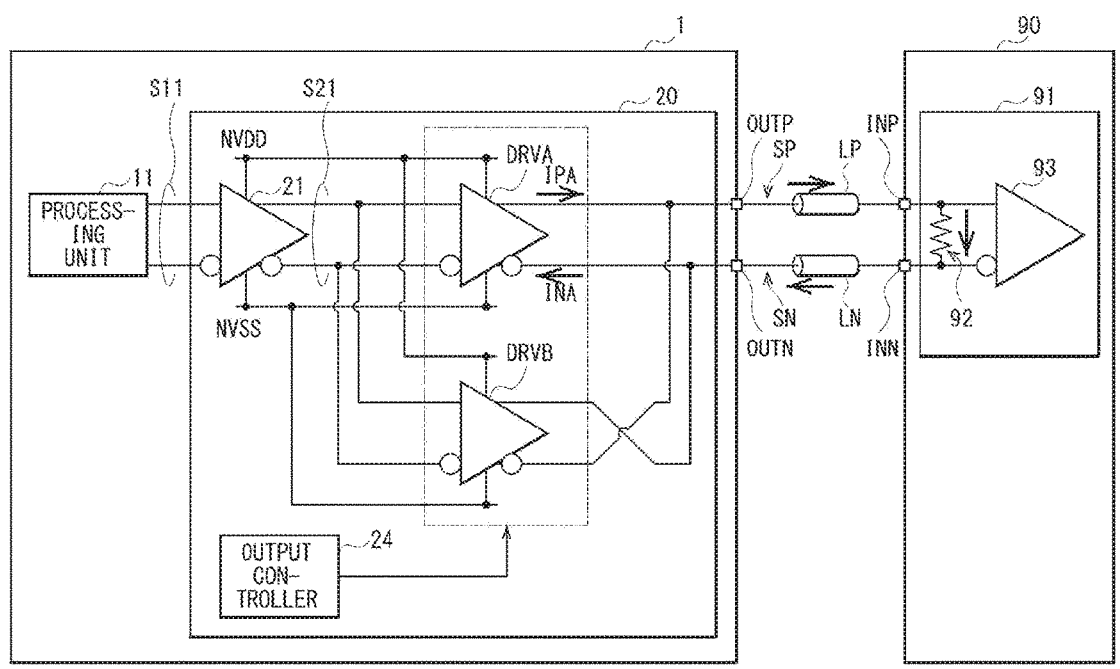

[FIG. 5]
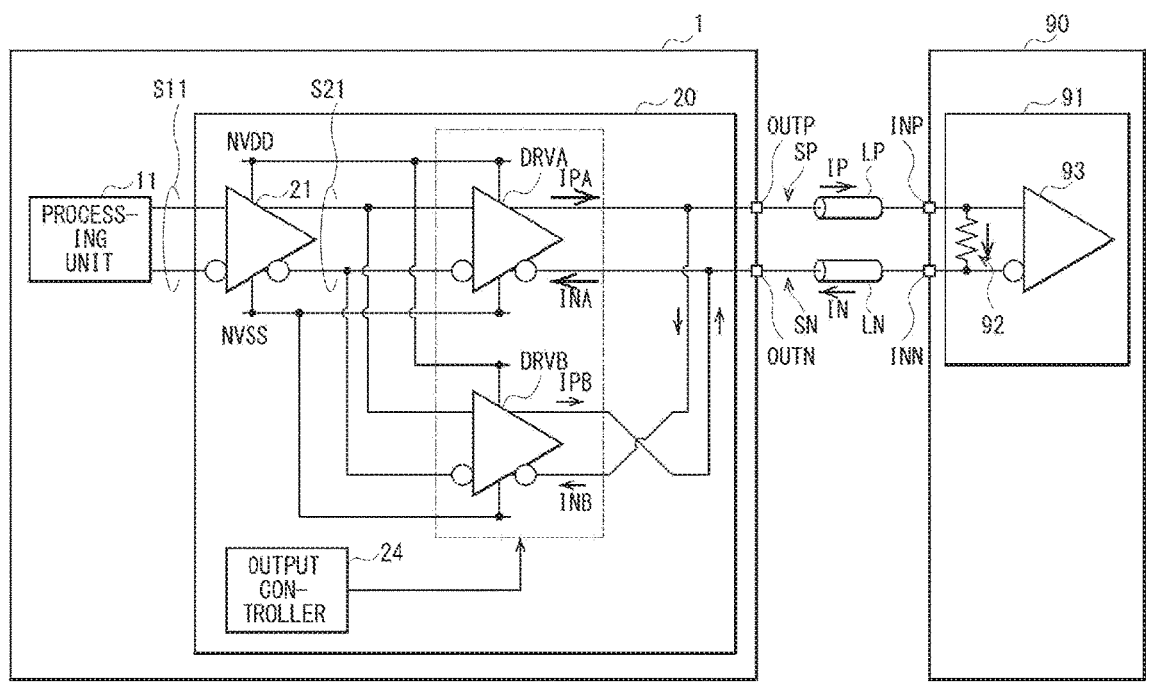

[FIG. 6]
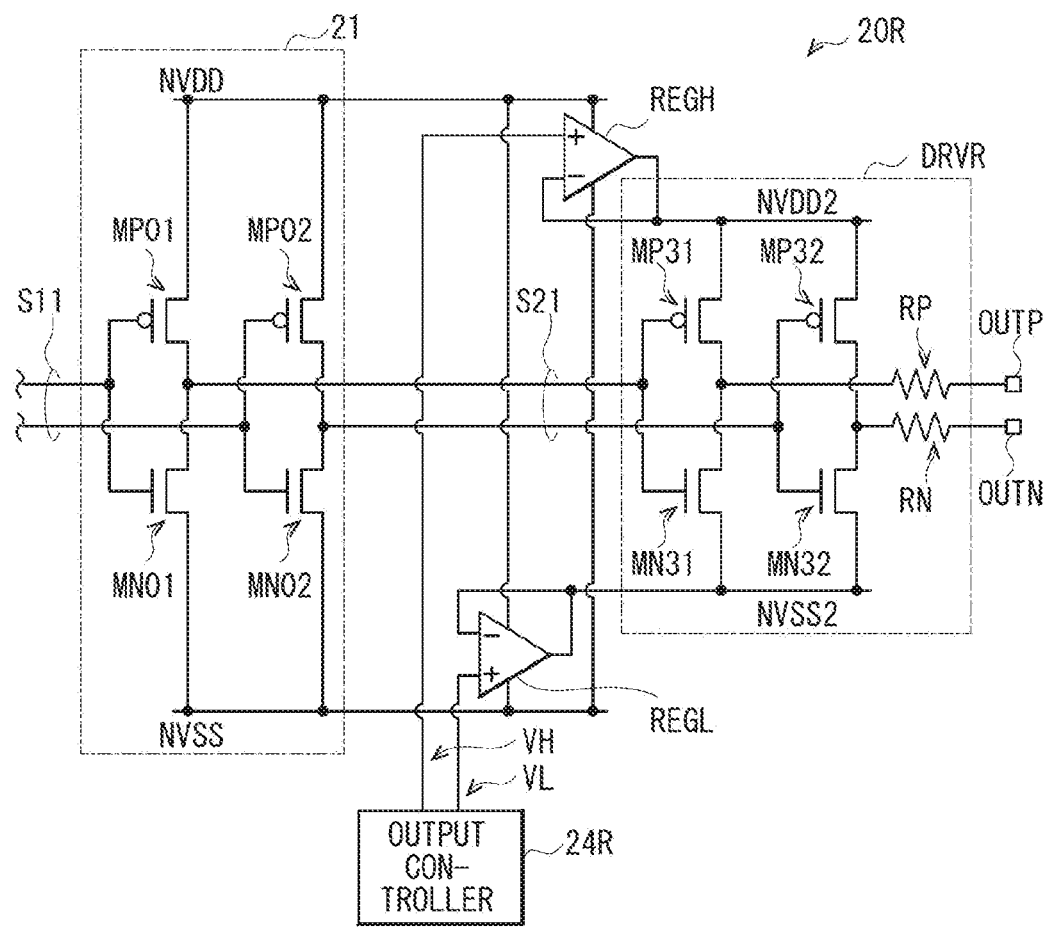

[FIG. 7]
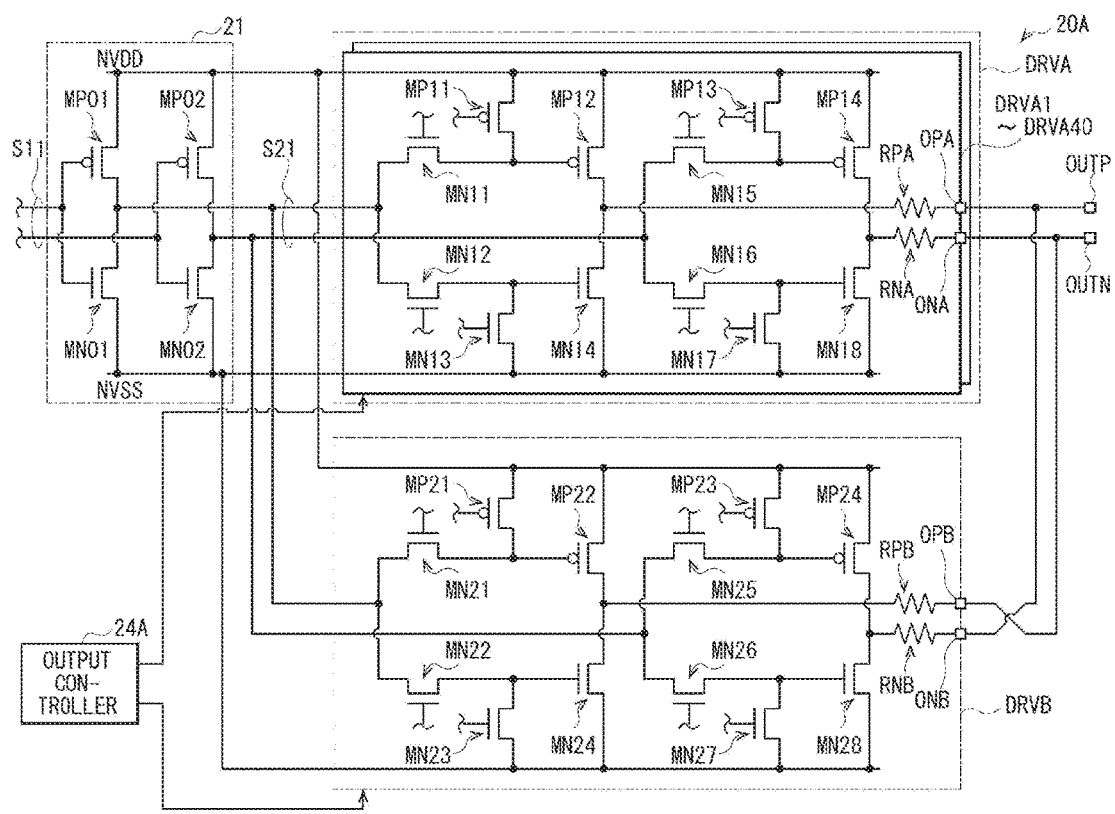

[FIG. 8]
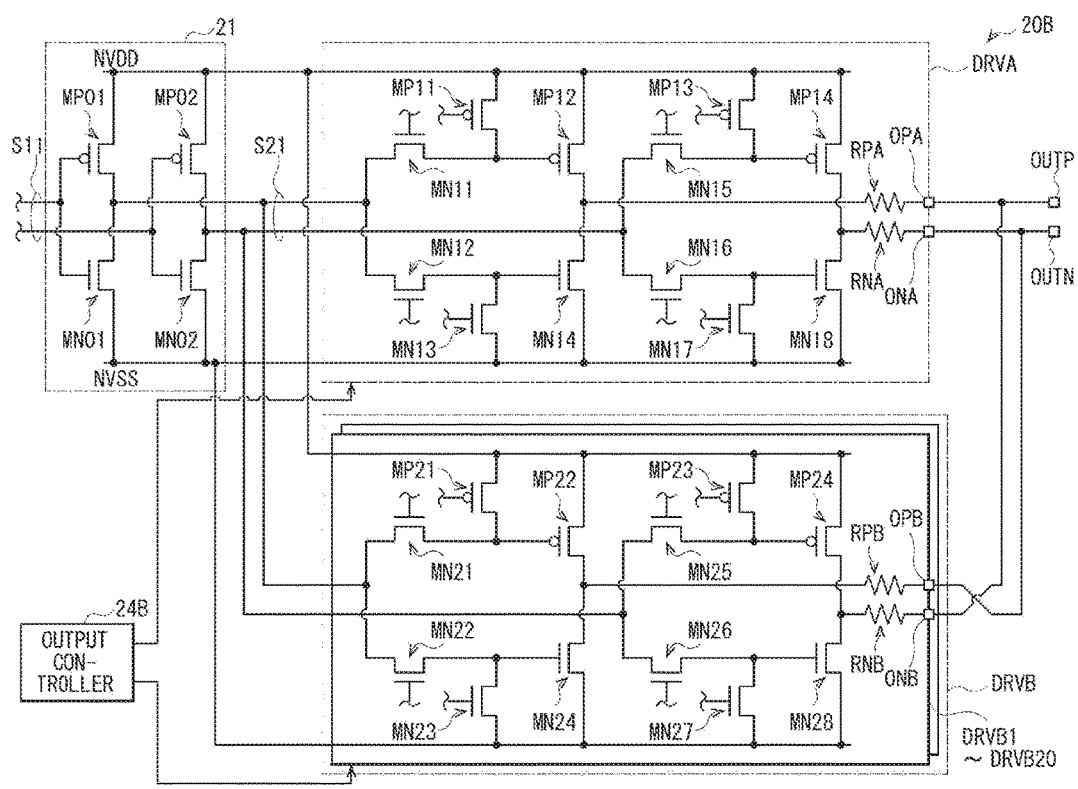

[FIG. 9]
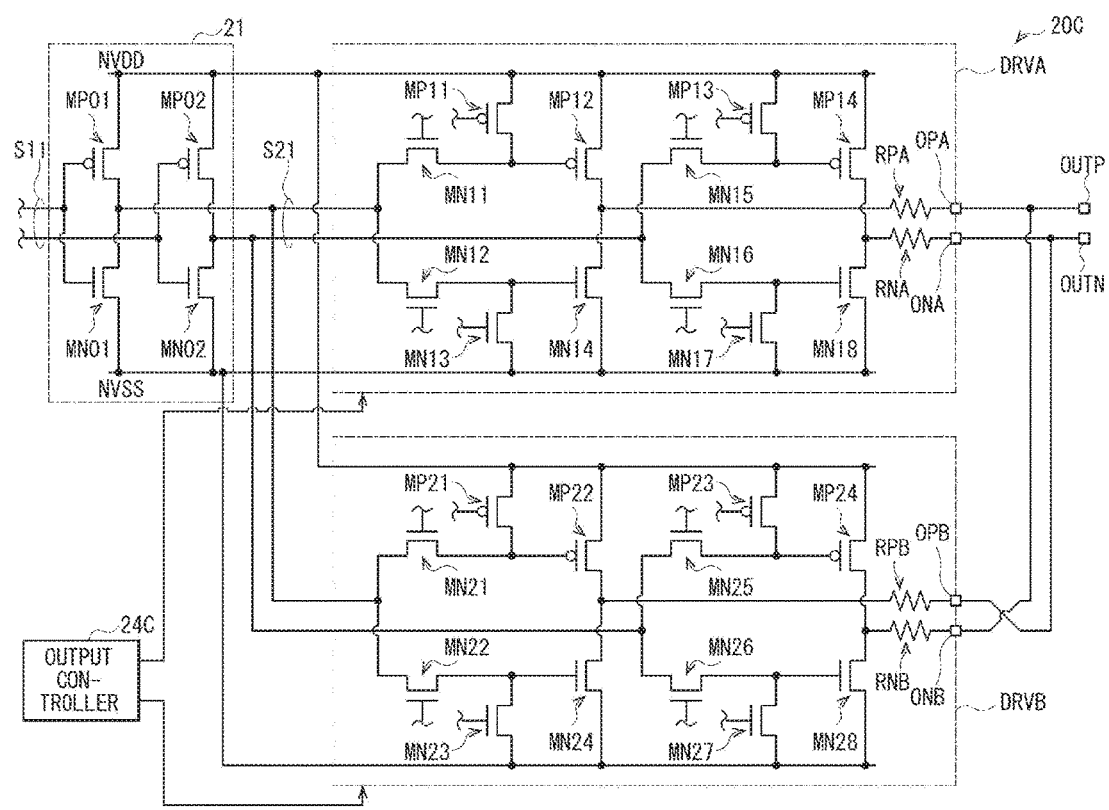

[FIG. 10]
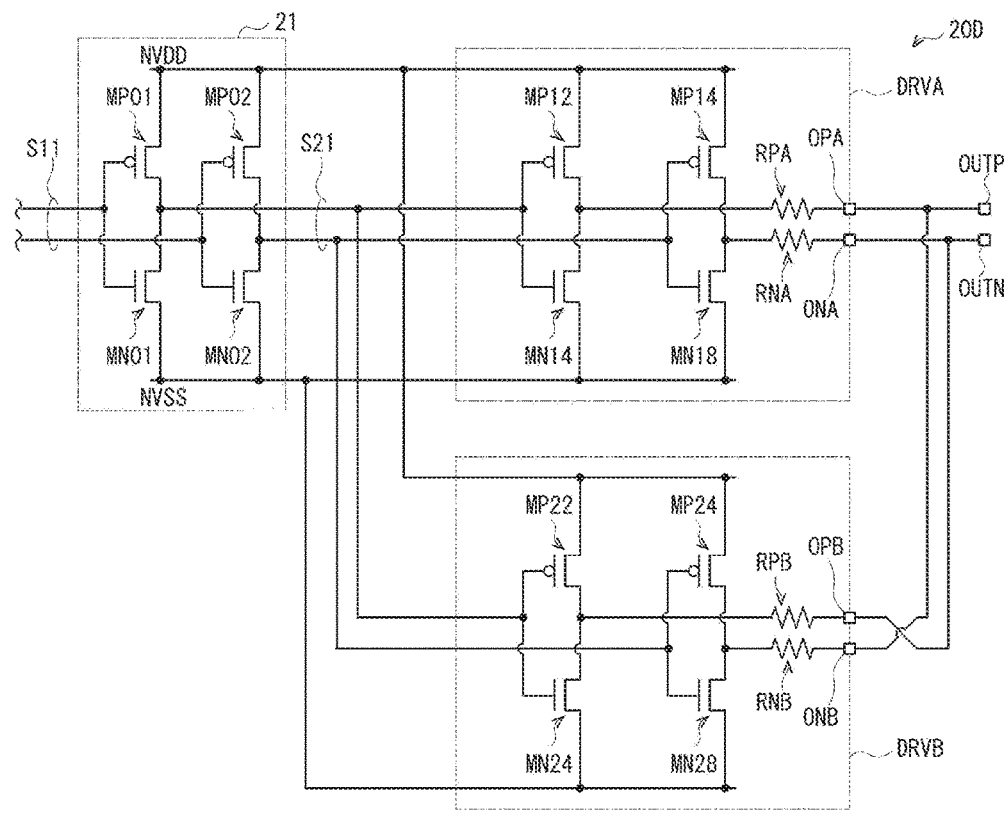

[FIG. 11]
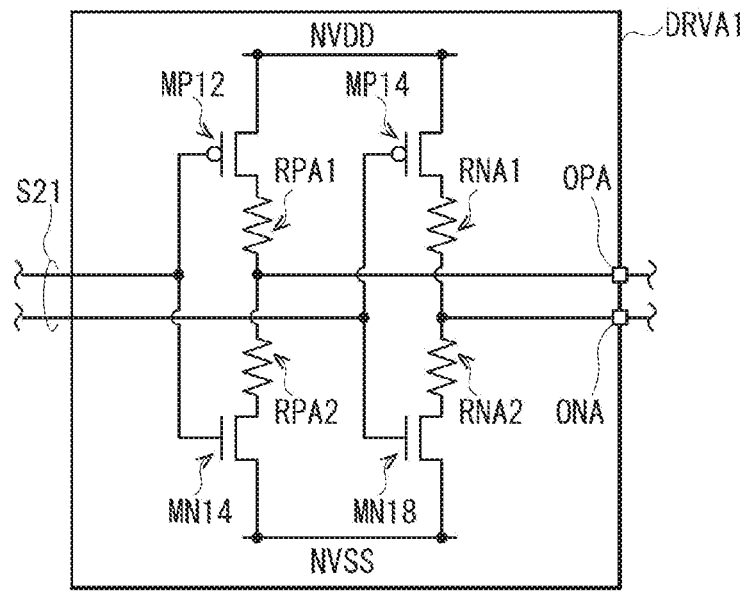
[FIG. 12]
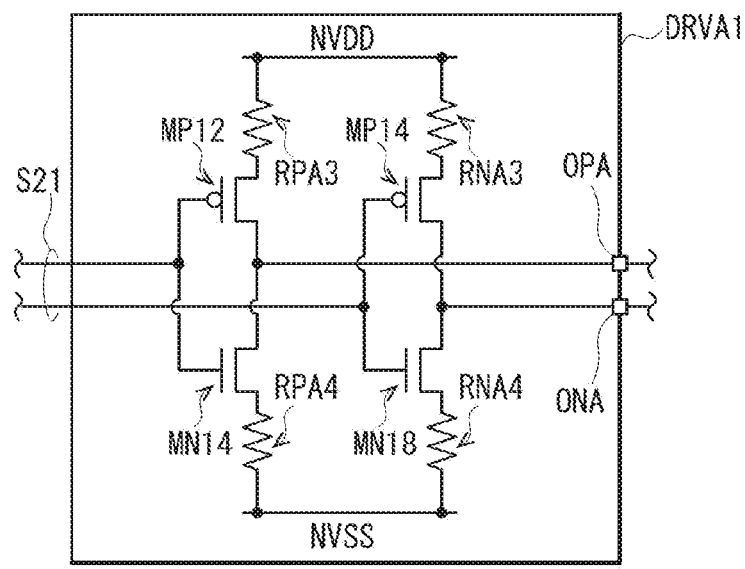

[FIG. 13]
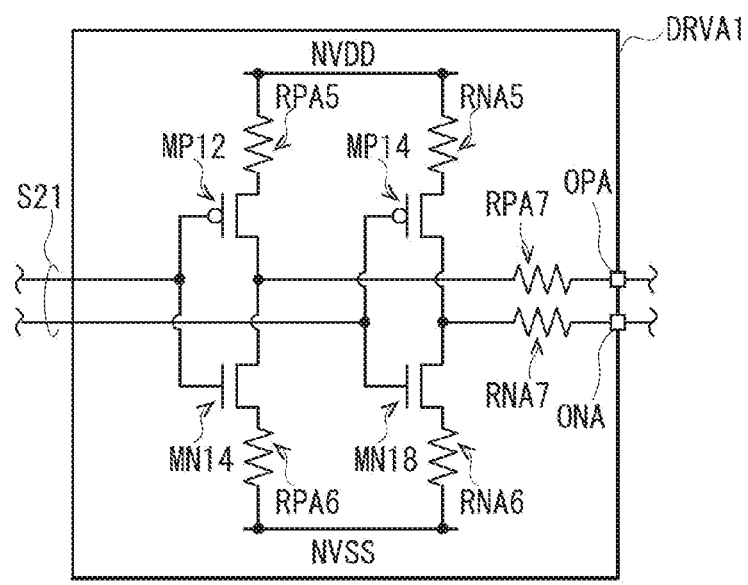

[FIG. 14]
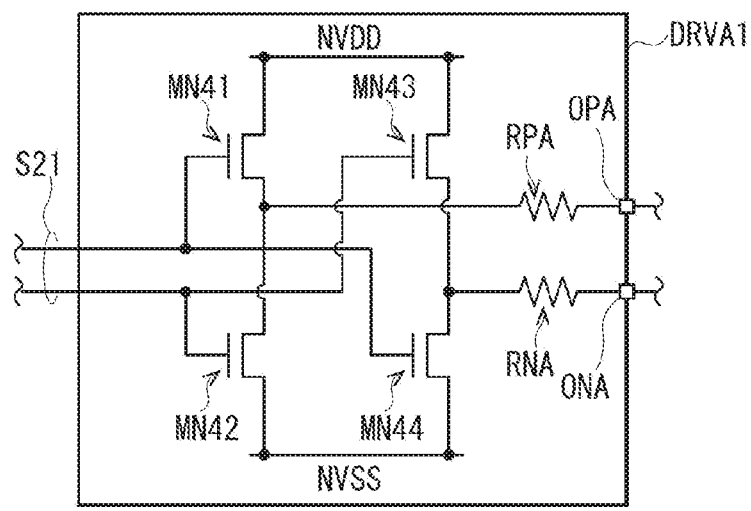
[FIG. 15]
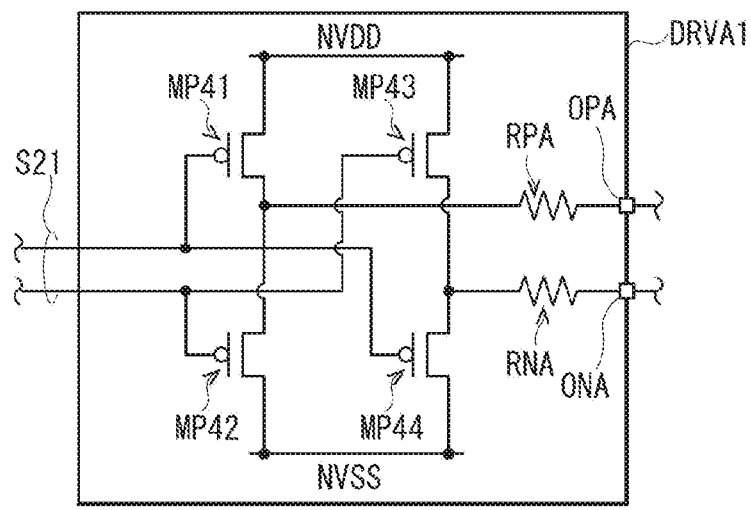

[FIG. 16]
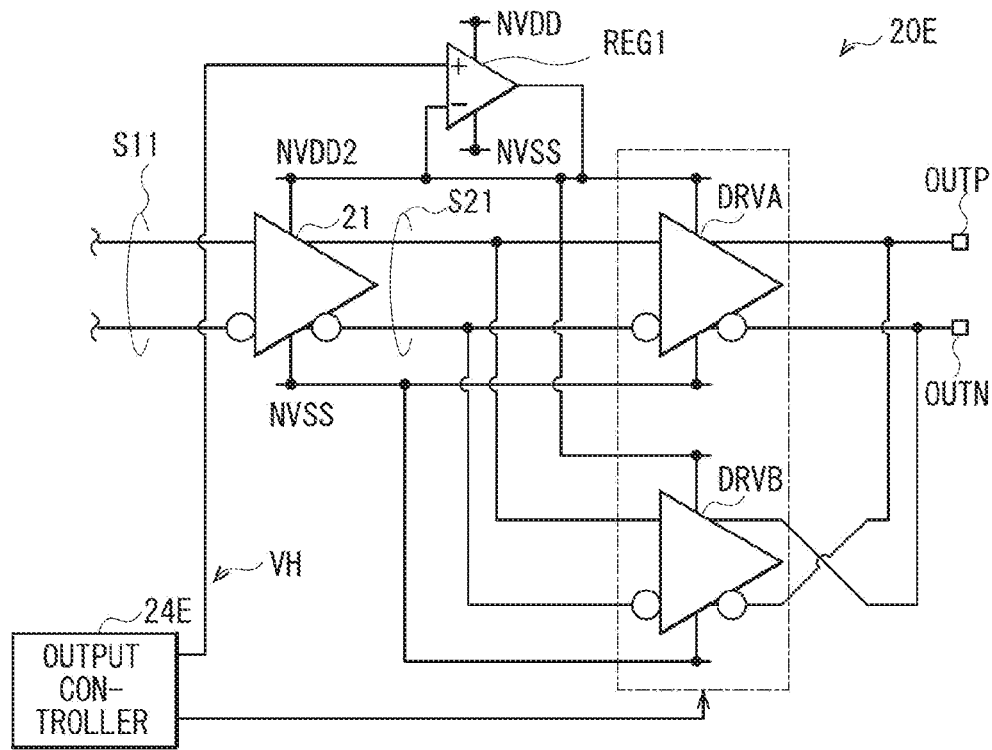
[FIG. 17]
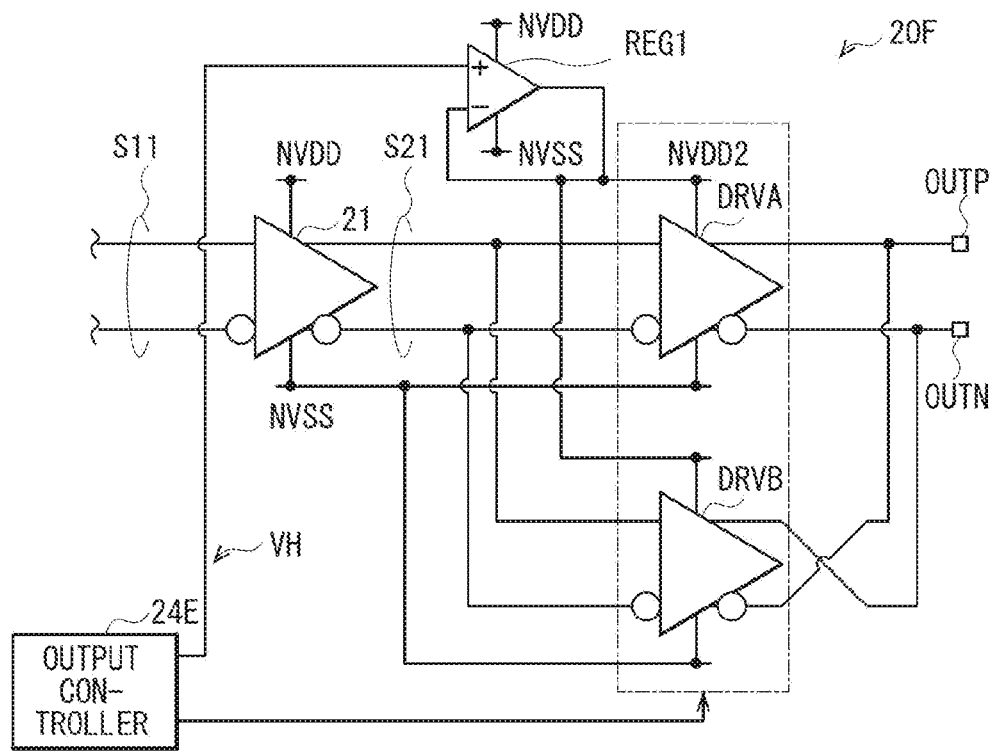

[FIG. 18]
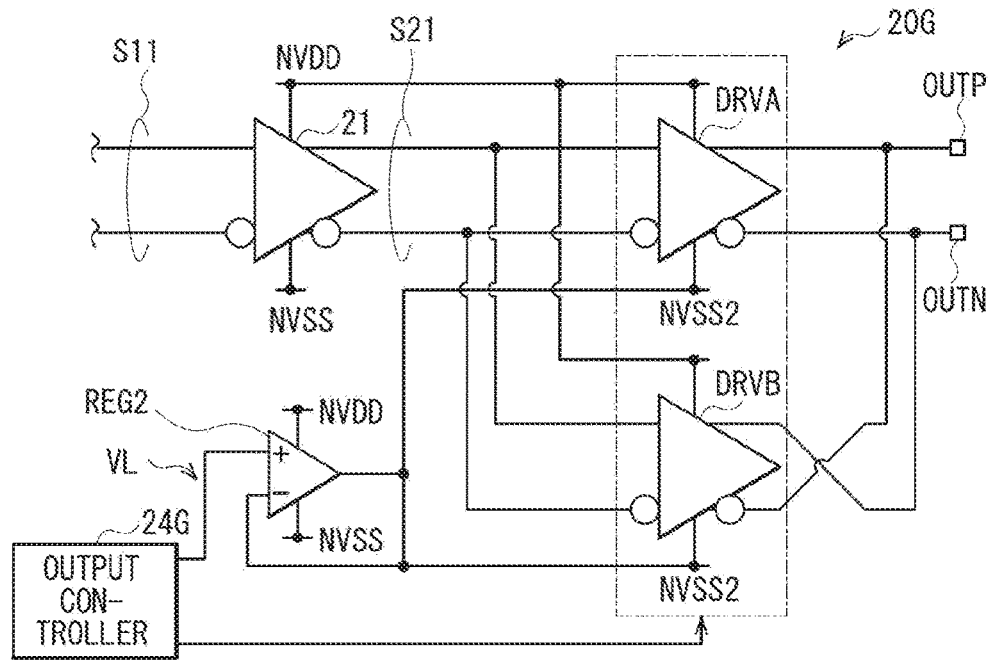
[FIG. 19]
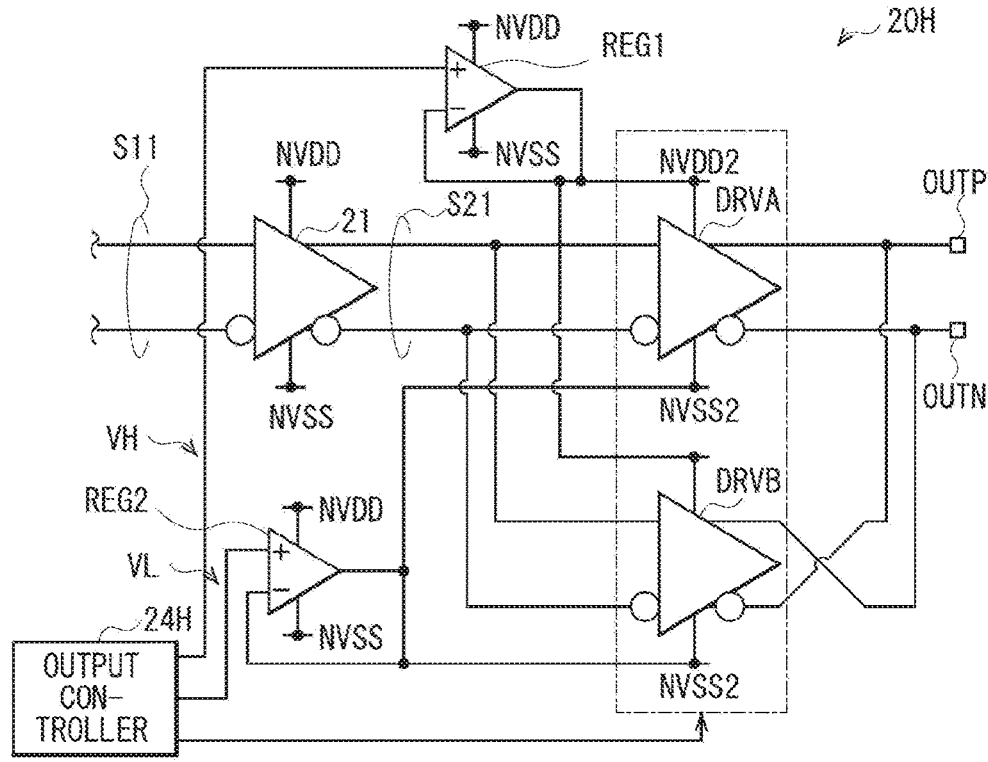

[FIG. 20]
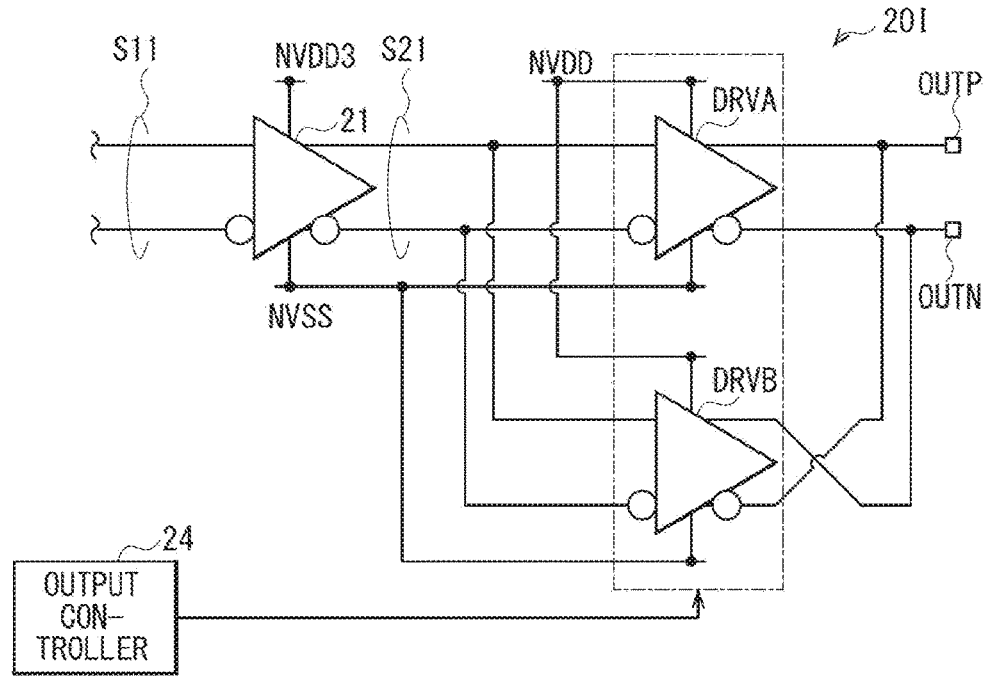
[FIG. 21]
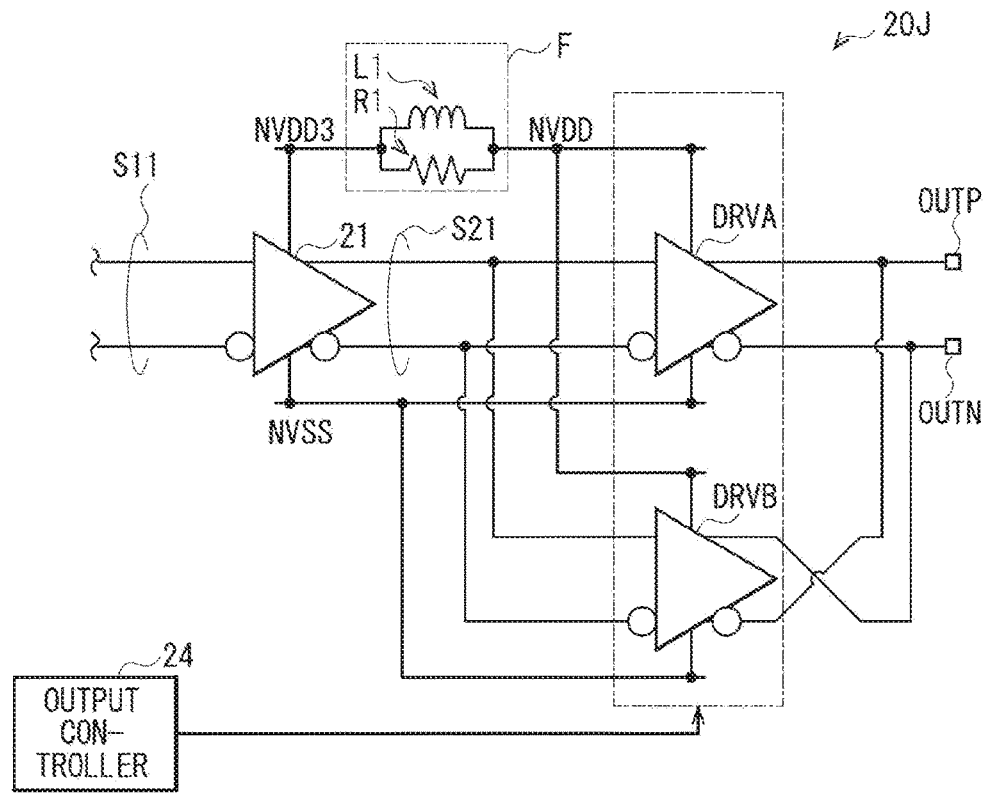

SEMICONDUCTOR DEVICE

CROSS REFERENCE TO RELATED APPLICATIONS

This application is a U.S. National Phase of International Patent Application No. PCT/JP2021/012479 filed on Mar. 25, 2021, which claims priority benefit of Japanese Patent Application No. JP 2020-078686 filed in the Japan Patent Office on Apr. 27, 2020. Each of the above-referenced applications is hereby incorporated herein by reference in its entirety.

TECHNICAL FIELD

The present disclosure relates to a semiconductor device that outputs a differential signal.

BACKGROUND ART

Signal transmission is often performed between a plurality of semiconductor devices. For example, PTL 1 discloses a technique of adjusting, by using a voltage regulator, a voltage amplitude of a signal to be transmitted.

CITATION LIST

Patent Literature

PTL 1: Japanese Unexamined Patent Application Publication (Published Japanese Translation of PCT Application) No. JP2016-525302

SUMMARY OF THE INVENTION

Incidentally, in a semiconductor device, a power supply voltage has become lower with progress of miniaturization in a manufacturing process. Accordingly, it is desired that a semiconductor device be able to operate at a low power supply voltage.

It is desirable to provide a semiconductor device that is able to operate at a low power supply voltage.

A semiconductor device according to an embodiment of the present disclosure includes a first output terminal and a second output terminal, a first driver, and a second driver. The first driver has a first positive terminal coupled to the first output terminal and a first negative terminal coupled to the second output terminal, and is configured to output a differential signal corresponding to a first signal from the first positive terminal and the first negative terminal. The second driver has a second positive terminal coupled to the second output terminal and a second negative terminal coupled to the first output terminal, and is configured to output a differential signal corresponding to the first signal from the second positive terminal and the second negative terminal.

In the semiconductor device according to the embodiment of the present disclosure, the first positive terminal of the first driver is coupled to the first output terminal, and the first negative terminal of the first driver is coupled to the second output terminal. The second positive terminal of the second driver is coupled to the second output terminal, and the second negative terminal of the second driver is coupled to the first output terminal. Further, in the first driver, the differential signal corresponding to the first signal is outputted from the first positive terminal and the first negative terminal. In the second driver, the differential signal corresponding to the first signal is outputted from the second positive terminal and the second negative terminal.

BRIEF DESCRIPTION OF DRAWINGS

FIG. 1 is a block diagram illustrating a configuration example of a semiconductor device according to an embodiment of the present disclosure.

FIG. 2 is a circuit diagram illustrating a configuration example of a transmission unit illustrated in FIG. 1.

FIG. 3A is an explanatory diagram illustrating an operation example of a driver illustrated in FIG. 2.

FIG. 3B is an explanatory diagram illustrating another operation example of the driver illustrated in FIG. 2.

FIG. 4 is an explanatory diagram illustrating an operation example of the semiconductor device illustrated in FIG. 1.

FIG. 5 is an explanatory diagram illustrating another operation example of the semiconductor device illustrated in FIG. 1.

FIG. 6 is a circuit diagram illustrating a configuration example of a transmission unit according to a comparative example.

FIG. 7 is a circuit diagram illustrating a configuration example of a transmission unit according to a modification example.

FIG. 8 is a circuit diagram illustrating a configuration example of a transmission unit according to another modification example.

FIG. 9 is a circuit diagram illustrating a configuration example of a transmission unit according to another modification example.

FIG. 10 is a circuit diagram illustrating a configuration example of a transmission unit according to another modification example.

FIG. 11 is a circuit diagram illustrating a configuration example of a driver according to another modification example.

FIG. 12 is a circuit diagram illustrating a configuration example of a driver according to another modification example.

FIG. 13 is a circuit diagram illustrating a configuration example of a driver according to another modification example.

FIG. 14 is a circuit diagram illustrating a configuration example of a driver according to another modification example.

FIG. 15 is a circuit diagram illustrating a configuration example of a driver according to another modification example.

FIG. 16 is a block diagram illustrating a configuration example of a transmission unit according to another modification example.

FIG. 17 is a block diagram illustrating a configuration example of a transmission unit according to another modification example.

FIG. 18 is a block diagram illustrating a configuration example of a transmission unit according to another modification example.

FIG. 19 is a block diagram illustrating a configuration example of a transmission unit according to another modification example.

FIG. 20 is a block diagram illustrating a configuration example of a transmission unit according to another modification example.

FIG. 21 is a block diagram illustrating a configuration example of a transmission unit according to another modification example.

MODES FOR CARRYING OUT THE INVENTION

In the following, embodiments of the present disclosure are described in detail with reference to the drawings.

Embodiment

Configuration Example

FIG. 1 illustrates a configuration example of a system including a semiconductor device (a semiconductor device 1) according to an embodiment. This system includes the semiconductor device 1, transmission lines LP and LN, and a semiconductor device 90. The semiconductor device 1 has output terminals OUTP and OUTN, and the semiconductor device 90 has input terminals INP and INN. The transmission lines LP and LN have a characteristic impedance of 50Ω in this example. The transmission line LP has one end coupled to the output terminal OUTP of the semiconductor device 1 and another end coupled to the input terminal INP of the semiconductor device 90. The transmission line LN has one end coupled to the output terminal OUTN of the semiconductor device 1 and another end coupled to the input terminal INN of the semiconductor device 90. The semiconductor device 1 is configured to transmit signals SP and SN to the semiconductor device 90 via the transmission lines LP and LN. The signals SP and SN configure a differential signal.

It is to be noted that, in this example, signal transmission is performed by so-called DC coupling, but this is not limitative. Alternatively, for example, signal transmission may be performed by so-called AC coupling. In this case, for example, the output terminal OUTP of the semiconductor device 1 and the input terminal INP of the semiconductor device 90 are coupled via the transmission line LP and a capacitor, and the output terminal OUTN of the semiconductor device 1 and the input terminal INN of the semiconductor device 90 are coupled via the transmission line LN and a capacitor.

The semiconductor device 1 includes a processing unit 11 and a transmission unit 20.

The processing unit 11 is configured to generate, by performing predetermined processing, a signal S11 including data to be transmitted to the semiconductor device 90. The signal S11 is a differential signal.

The transmission unit 20 is configured to generate the signals SP and SN on the basis of the signal S11, and transmit the signals SP and SN to the semiconductor device 90. The transmission unit 20 includes a buffer circuit 21, drivers DRVA and DRVB, and an output controller 24.

The buffer circuit 21 is configured to generate a signal S21 on the basis of the signal S11. The signal S21 is a differential signal. The buffer circuit 21 operates on the basis of a power supply voltage VDD at a power supply node NVDD and a ground voltage VSS at a ground node NVSS. For example, the power supply node NVDD is supplied with the power supply voltage VDD from the outside of the semiconductor device 1, and the ground node NVSS is supplied with the ground voltage VSS from the outside of the semiconductor device 1.

The drivers DRVA and DRVB are configured to generate the signals SP and SN on the basis of the signal S21. Each of the drivers DRVA and DRVB operates on the basis of the power supply voltage VDD at the power supply node NVDD and the ground voltage VSS at the ground node NVSS. The driver DRVA has a positive output terminal coupled to the output terminal OUTP of the semiconductor device 1 and a negative output terminal coupled to the output terminal OUTN of the semiconductor device 1. In addition, the driver DRVB has a positive output terminal coupled to the output terminal OUTN of the semiconductor device 1 and a negative output terminal coupled to the output terminal OUTP of the semiconductor device 1.

The output controller 24 is configured to adjust output impedance of the transmission unit 20 and adjust amplitudes of the signals SP and SN.

FIG. 2 illustrates a configuration example of the transmission unit 20 more specifically.

The buffer circuit 21 includes transistors MP01, MN01, MP02, and MN02. The transistors MP01 and MP02 are P-type MOS (Metal Oxide Semiconductor) transistors, and the transistors MN01 and MN02 are N-type MOS transistors.

The transistor MP01 has a gate coupled to a gate of the transistor MN01 and coupled to the processing unit 11, a source coupled to the power supply node NVDD, and a drain coupled to a drain of the transistor MN01 and coupled to the drivers DRVA and DRVB. The transistor MN01 has the gate coupled to the gate of the transistor MP01 and coupled to the processing unit 11, the drain coupled to the drain of the transistor MP01 and coupled to the drivers DRVA and DRVB, and a source coupled to the ground node NVSS. The transistor MP02 has a gate coupled to a gate of the transistor MN02 and coupled to the processing unit 11, a source coupled to the power supply node NVDD, and a drain coupled to a drain of the transistor MN02 and coupled to the drivers DRVA and DRVB. The transistor MN02 has the gate coupled to the gate of the transistor MP02 and coupled to the processing unit 11, the drain coupled to the drain of the transistor MP02 and coupled to the drivers DRVA and DRVB, and a source coupled to the ground node NVSS.

The driver DRVA includes drivers DRVA1 to DRVA40. The drivers DRVA1 to DRVA40 have the same circuit configuration as each other. In the semiconductor device 1, for example, the drivers DRVA1 to DRVA40 may have the same layout pattern as each other. The driver DRVA1 is described as an example below. The driver DRVA1 includes transistors MP11 to MP14, transistors MN11 to MN18, resistors RPA and RNA, and output terminals OPA and ONA. The transistors MP11 to MP14 are P-type MOS transistors, and the transistors MN11 to MN18 are N-type MOS transistors.

The transistor MN11 has a gate to be supplied with a control signal from the output controller 24, a source coupled to a source of the transistor MN12 and coupled to the drains of the transistors MP01 and MN01 of the buffer circuit 21, and a drain coupled to a drain of the transistor MP11 and a gate of the transistor MP12. The transistor MP11 has a gate to be supplied with a control signal from the output controller 24, a source coupled to the power supply node NVDD, and the drain coupled to the drain of the transistor MN11 and the gate of the transistor MP12. The transistor MP12 has the gate coupled to the drains of the transistors MN11 and MP11, a source coupled to the power supply node NVDD, and a drain coupled to a drain of the transistor MN14 and one end of the resistor RPA.

The transistor MN12 has a gate to be supplied with a control signal from the output controller 24, the source coupled to the source of the transistor MN11 and coupled to the drains of the transistors MP01 and MN01 of the buffer circuit 21, and a drain coupled to a drain of the transistor MN13 and a gate of the transistor MN14. The transistor MN13 has a gate to be supplied with a control signal from the output controller 24, the drain coupled to the drain of the transistor MN12 and the gate of the transistor MN14, and a source coupled to the ground node NVSS. The transistor MN14 has the gate coupled to the drains of the transistors MN12 and MN13, the drain coupled to the drain of the transistor MP12 and the one end of the resistor RPA, and a source coupled to the ground node NVSS.

The transistor MN15 has a gate to be supplied with a control signal from the output controller 24, a source coupled to a source of the transistor MN16 and coupled to the drains of the transistors MP02 and MN02 of the buffer circuit 21, and a drain coupled to a drain of the transistor MP13 and a gate of the transistor MP14. The transistor MP13 has a gate to be supplied with a control signal from the output controller 24, a source coupled to the power supply node NVDD, and the drain coupled to the drain of the transistor MN15 and the gate of the transistor MP14. The transistor MP14 has the gate coupled to the drains of the transistors MN15 and MP13, a source coupled to the power supply node NVDD, and a drain coupled to a drain of the transistor MN18 and one end of the resistor RNA.

The transistor MN16 has a gate to be supplied with a control signal from the output controller 24, the source coupled to the source of the transistor MN15 and coupled to the drains of the transistors MP02 and MN02 of the buffer circuit 21, and a drain coupled to a drain of the transistor MN17 and a gate of the transistor MN18. The transistor MN17 has a gate to be supplied with a control signal from the output controller 24, the drain coupled to the drain of the transistor MN16 and the gate of the transistor MN18, and a source coupled to the ground node NVSS. The transistor MN18 has the gate coupled to the drains of the transistors MN16 and MN17, the drain coupled to the drain of the transistor MP14 and the one end of the resistor RNA, and a source coupled to the ground node NVSS.

The resistor RPA corresponds to output termination resistance related to the output terminal OUTP of the semiconductor device 1. The resistor RPA has one end coupled to the drains of the transistors MP12 and MN14 and another end coupled to the output terminal OPA of the driver DRVA1. In this example, a resistance value of the resistor RPA is set in such a manner that in a case where the transistor MP12 is in an on state, the sum of an on-resistance value of the transistor MP12 and the resistance value of the resistor RPA is 1500Ω, and in a case where the transistor MN14 is in the on state, the sum of an on-resistance value of the transistor MN14 and the resistance value of the resistor RPA is 1500Ω.

The resistor RNA corresponds to output termination resistance related to the output terminal OUTN of the transmission unit 20. The resistor RNA has one end coupled to the drains of the transistors MP14 and MN18 and another end coupled to the output terminal ONA of the driver DRVA1. In this example, a resistance value of the resistor RNA is set in such a manner that in a case where the transistor MP14 is in the on state, the sum of an on-resistance value of the transistor MP14 and the resistance value of the resistor RNA is 1500Ω, and in a case where the transistor MN18 is in the on state, the sum of an on-resistance value of the transistor MN18 and the resistance value of the resistor RNA is 1500Ω.

The output terminal OPA is a positive output terminal of the driver DRVA1, and corresponds to the positive output terminal of the driver DRVA. The output terminal OPA of each of the drivers DRVA1 to DRVA40 is coupled to the output terminal OUTP of the semiconductor device 1. The output terminal ONA is a negative output terminal of the driver DRVA1, and corresponds to the negative output terminal of the driver DRVA. The output terminal ONA of each of the drivers DRVA1 to DRVA40 is coupled to the output terminal OUTN of the semiconductor device 1.

In the driver DRVA, one or a plurality of drivers that are to operate, out of the drivers DRVA1 to DRVA40, are set. Thus, in the transmission unit 20, it is possible to adjust the output impedance and adjust the amplitudes of the signals SP and SN.

The driver DRVB includes DRVB1 to DRVB20. The drivers DRVB1 to DRVB20 have the same circuit configuration as each other. In the semiconductor device 1, for example, the drivers DRVB1 to DRVB20 may have the same layout pattern as each other. The driver DRVB1 is described as an example below. The driver DRVB1 includes transistors MP21 to MP24, transistors MN21 to MN28, resistors RPB and RNB, and output terminals OPB and ONB.

The transistors MP21 to MP24 are P-type MOS transistors, and the transistors MN21 to MN28 are N-type MOS transistors. In this example, the circuit configuration of the driver DRVB1 is the same as the circuit configuration of the driver DRVA1. The transistors MP21 to MP24 correspond respectively to the transistors MP11 to MP14 in the driver DRVA1, the transistors MN21 to MN28 correspond respectively to the transistors MN11 to MN18 in the driver DRVA1, and the resistors RPB and RNB correspond respectively to the resistors RPA and RNA in the driver DRVA1. In the semiconductor device 1, for example, the layout pattern of the driver DRVB1 may be the same as the layout pattern of the driver DRVA1.

The output terminal OPB is a positive output terminal of the driver DRVB1, and corresponds to the positive output terminal of the driver DRVB. The output terminal OPB of each of the drivers DRVB1 to DRVB20 is coupled to the output terminal OUTN of the semiconductor device 1. The output terminal ONB is a negative output terminal of the driver DRVB1, and corresponds to the negative output terminal of the driver DRVB. The output terminal ONB of each of the drivers DRVB1 to DRVB20 is coupled to the output terminal OUTP of the semiconductor device 1.

In the driver DRVB, one or a plurality of drivers that are to operate, out of the drivers DRVB1 to DRVB20, are set. Thus, in the transmission unit 20, it is possible to adjust the output impedance and adjust the amplitudes of the signals SP and SN.

The output controller 24 sets one or a plurality of drivers to be operated out of the drivers DRVA1 to DRVA40, and sets one or a plurality of drivers to be operated out of the driver DRVB1 to the driver DRVB20. Specifically, the output controller 24 sets one or a plurality of drivers to be operated out of the drivers DRVA1 to DRVA40 by controlling operation of the transistors MP11, MN11 to MN13, MP13, and MN15 to MN17 in each of the drivers DRVA1 to DRVA40. In addition, the output controller 24 sets one or a plurality of drivers to be operated out of the drivers DRVB1 to DRVB20 by controlling operation of the transistors MP21, MN21 to MN23, MP23, and MN25 to MN27 in each of the drivers DRVB1 to DRVB20.

FIGS. 3A and 3B illustrate an operation example of the output controller 24. FIG. 3A illustrates a case of operating the driver DRVA1, and FIG. 3B illustrates a case of not operating the driver DRVA1. It is to be noted that the same applies to the drivers DRVA2 to DRVA40 and DRVB1 to DRVB20. In FIGS. 3A and 3B, MP11, MN11 to MN13, MP13, and MN15 to MN17 are indicated by switches indicating operation states of the transistors.

In the case of operating the driver DRVA1, as illustrated in FIG. 3A, the output controller 24 puts the transistors MN11, MN12, MN15, and MN16 of the driver DRVA1 into the on state, and puts the transistors MP11, MP13, MP13, and MN17 into an off state. Thus, the driver DRVA1 operates on the basis of the signal S21. In this manner, the output controller 24 is able to operate the driver DRVA1.

In the case of not operating the driver DRVA1, as illustrated in FIG. 3B, the output controller 24 puts the transistors MN11, MN12, MN15, and MN16 of the driver DRVA1 into the off state, and puts the transistors MP11, MP13, MP13, and MN17 into the on state. Thus, the gates of the transistors MP12 and MP14 are coupled to the power supply node NVDD, which puts the transistors MP12 and MP14 into the off state, and the gates of the transistors MN14 and MN18 are coupled to the ground node NVSS, which puts the transistors MN14 and MN18 into the off state. Thus, the driver DRVA1 does not operate on the basis of the signal S21, and output impedance of the driver DRVA1 becomes high impedance regardless of the signal S21. In this manner, the output controller 24 is able to prevent the driver DRVA1 from operating.

The output controller 24 is able to, individually, bring each of the drivers DRVA1 to DRVA40 and DRVB1 to DRVB20 into operation or prevent each of the drivers DRVA1 to DRVA40 and DRVB1 to DRVB20 from operating. In this manner, the output controller 24 sets one or a plurality of drivers to be operated out of the drivers DRVA1 to DRVA40, and sets one or a plurality of drivers to be operated out of the driver DRVB1 to the driver DRVB20. Thus, as will be described later, the output controller 24 is able to adjust the output impedance of the transmission unit 20 and able to adjust the amplitudes of the signals SP and SN.

The semiconductor device 90 includes a reception unit 91, as illustrated in FIG. 1. The reception unit 91 is configured to receive the signals SP and SN transmitted from the semiconductor device 1. The reception unit 91 includes a resistor 92 and a receiver 93.

The resistor 92 is input termination resistance of the reception unit 91. The resistor 92 has one end coupled to the input terminal INP of the semiconductor device 90 and another end coupled to the input terminal INN of the semiconductor device 90. The resistor 92 has a resistance value of about 100Ω in this example.

The receiver 93 is configured to receive the signals SP and SN. The receiver 93 has a positive input terminal coupled to the input terminal INP of the semiconductor device 90 and a negative input terminal coupled to the input terminal INN of the semiconductor device 90.

The semiconductor device 90 performs predetermined processing on the basis of data included in the signals SP and SN received by the reception unit 91.

Here, the output terminal OUTP corresponds to a specific example of a "first output terminal" in the present disclosure. The output terminal OUTN corresponds to a specific example of a "second output terminal" in the present disclosure. For example, the driver DRVA1 corresponds to a specific example of a "first driver" in the present disclosure. The output terminal OPA corresponds to a specific example of a "first positive terminal" in the present disclosure. The output terminal ONA corresponds to a specific example of a "first negative terminal" in the present disclosure. For example, the driver DRVB1 corresponds to a specific example of a "second driver" in the present disclosure. The output terminal OPB corresponds to a specific example of a "second positive terminal" in the present disclosure. The output terminal ONB corresponds to a specific example of a "second negative terminal" in the present disclosure. The signal S21 corresponds to a specific example of a "first signal" in the present disclosure. The output controller 24 corresponds to a specific example of a "controller" in the present disclosure. The buffer circuit 21 corresponds to a specific example of a "buffer circuit" in the present disclosure.

The power supply node NVDD corresponds to a specific example of a "first power supply node" in the present disclosure. The ground node NVSS corresponds to a specific example of a "second power supply node" in the present disclosure. The transistor MP12 corresponds to a specific example of a "first transistor" in the present disclosure. The transistor MN14 corresponds to a specific example of a "second transistor" in the present disclosure. The transistor MP14 corresponds to a specific example of a "third transistor" in the present disclosure. The transistor MN18 corresponds to a specific example of a "fourth transistor" in the present disclosure. The transistor MP22 corresponds to a specific example of a "fifth transistor" in the present disclosure. The transistor MN24 corresponds to a specific example of a "sixth transistor" in the present disclosure. The transistor MP24 corresponds to a specific example of a "seventh transistor" in the present disclosure. The transistor MN28 corresponds to a specific example of an "eighth transistor" in the present disclosure. The resistor RPA corresponds to a specific example of a "first resistor" in the present disclosure. The resistor RNA corresponds to a specific example of a "second resistor" in the present disclosure.

[Operation and Workings]

Next, description is given of operation and workings of the semiconductor device 1 according to the present embodiment.

(Overview of Overall Operation)

First, an overview of the overall operation of the semiconductor device 1 is described with reference to FIG. 1. The processing unit 11 generates, by performing predetermined processing, the signal S11 including data to be transmitted to the semiconductor device 90. The transmission unit 20 generates the signals SP and SN on the basis of the signal S11, and transmits the signals SP and SN to the semiconductor device 90. Specifically, the buffer circuit 21 generates the signal S21 on the basis of the signal S11. The drivers DRVA and DRVB generate the signals SP and SN on the basis of the signal S21. The output controller 24 adjusts the output impedance of the transmission unit 20 and adjusts the amplitudes of the signals SP and SN.

(Concerning Operation of Output Controller 24)

The output controller 24 sets one or a plurality of drivers to be operated out of the drivers DRVA1 to DRVA40, and sets one or a plurality of drivers to be operated out of the driver DRVB1 to the driver DRVB20. This enables the output controller 24 to adjust the output impedance of the transmission unit 20 and adjust the amplitudes of the signals SP and SN.

For example, in the transmission unit 20, the output impedance of the transmission unit 20 may be adjusted by, for example, changing the total number of the number of drivers to be operated out of the drivers DRVA1 to DRVA40 and the number of drivers to be operated out of the driver DRVB1 to the driver DRVB20.

Specifically, in the transmission unit 20, for example, in a case where the total number of the number of drivers to be operated out of the drivers DRVA1 to DRVA40 and the number of drivers to be operated out of the driver DRVB1 to the driver DRVB20 is 30, it is possible to make the output impedance of the transmission unit 20 about 50Ω (=1500/30). Further, it is possible to make the output impedance of the transmission unit 20 lower by increasing this total number, and it is possible to make the output impedance of the transmission unit 20 higher by reducing this total number. Thus, in the semiconductor device 1, even in a case where the output impedance of the transmission unit 20 deviates from a desired value (50Ω in this example) due to so-called process variation in a manufacturing process of the semiconductor device 1, it is possible to adjust the output impedance.

In addition, in the transmission unit 20, for example, balance between the number of drivers to be operated out of the drivers DRVA1 to DRVA40 and the number of drivers to be operated out of the driver DRVB1 to the driver DRVB20 may be changed, while keeping the total number of the number of drivers to be operated out of the drivers DRVA1 to DRVA40 and the number of drivers to be operated out of the driver DRVB1 to the driver DRVB20. This makes it possible to adjust the amplitudes of the signals SP and SN, while keeping the output impedance of the transmission unit 20.

Specifically, for example, in a case where 30 drivers out of the drivers DRVA1 to DRVA40 are brought into operation and all of the drivers DRVB1 to DRVB20 are prevented from operating, the driver DRVA out of the drivers DRVA and DRVB generates the signals SP and SN.

FIG. 4 illustrates an operation example of the semiconductor device 1. In this example, the transmission unit 20 sets the signal SP at a high level and sets the signal SN at a low level. In this example, the driver DRVA out of the drivers DRVA and DRVB is operating; therefore, a current IPA that flows out from the positive output terminal of the driver DRVA flows into the input terminal INP of the semiconductor device 90 via the transmission line LP. This current flows through the resistor 92 of the reception unit 91, flows out from the input terminal INN of the semiconductor device 90, and flows, as a current INA, into the negative output terminal of the driver DRVA via the transmission line LN. On the other hand, in a case where the signal SN is at the high level and the signal SP is at the low level, current flows in a direction opposite to the direction of the current illustrated in FIG. 4. The amplitudes of the signals SP and SN is determined by the product of the current that flows through the resistor 92 and the resistance value of the resistor 92.

Further, for example, the number of drivers to be operated out of the driver DRVB1 to the driver DRVB20 is increased, while keeping the total number of the number of drivers to be operated out of the drivers DRVA1 to DRVA40 and the number of drivers to be operated out of the driver DRVB1 to the driver DRVB20. In that case, the number of drivers to be operated out of the drivers DRVA1 to DRVA40 is made larger than the number of drivers to be operated out of the drivers DRVB1 to DRVB20. Thus, in the semiconductor device 1, it is possible to adjust the amplitudes of the signals SP and SN, while keeping the output impedance of the transmission unit 20.

FIG. 5 illustrates another operation example of the semiconductor device 1. FIG. 5 illustrates arrows indicating currents. The arrow is larger for a larger current value. The number of drivers to be operated out of the drivers DRVA1 to DRVA40 is larger than the number of drivers to be operated out of the drivers DRVB1 to DRVB20; therefore, the current IPA that flows through the positive output terminal of the driver DRVA and the current INA that flows through the negative output terminal thereof are larger than a current IPB that flows through the positive output terminal of the driver DRVB and a current INB that flows through the negative output terminal thereof.

The output terminal OUTP of the semiconductor device 1 is coupled to the positive output terminal of the driver DRVA and the negative output terminal of the driver DRVB; therefore, a part of the current IPA that flows out from the positive output terminal of the driver DRVA flows into the negative output terminal of the driver DRVB as the current INB. Further, the rest of the current (the current IPA—the current INB) flows into the input terminal INP of the semiconductor device 90 as a current IP. This current flows through the resistor 92 of the reception unit 91, and flows out from the input terminal INN of the semiconductor device 90 as a current IN.

The output terminal OUTN of the semiconductor device 1 is coupled to the negative output terminal of the driver DRVA and the positive output terminal of the driver DRVB; therefore, the total current of the current IN that flows out from the input terminal INN of the semiconductor device 90 and the current IPB that flows out from the positive output terminal of the driver DRVB flows into the negative output terminal of the driver DRVA as the current INA.

Thus, the output terminal OUTP of the semiconductor device 1 is coupled to the positive output terminal of the driver DRVA and the negative output terminal of the driver DRVB, and the output terminal OUTN of the semiconductor device 1 is coupled to the negative output terminal of the driver DRVA and the positive output terminal of the driver DRVB; therefore, an output current of the driver DRVA is bypassed in opposite phase by the driver DRVB. In this manner, in the semiconductor device 1, it is possible to adjust the current that flows through the resistor 92 of the reception unit 91. As described above, the amplitudes of the signals SP and SN is determined by the product of the current that flows through the resistor 92 and the resistance value of the resistor 92; therefore, in the semiconductor device 1, thus adjusting the current that flows through the resistor 92 of the reception unit 91 makes it possible to adjust the amplitudes of the signals SP and SN.

As described above, in the semiconductor device 1, it is possible to adjust the amplitudes of the signals SP and SN. Thus, in the semiconductor device 1, even in a case where the amplitudes of the signals SP and SN deviate from desired amplitudes due to so-called process variation in the manufacturing process of the semiconductor device 1, it is possible to adjust the amplitudes of the signals SP and SN.

Comparative Example

Next, workings of the semiconductor device 1 according to the embodiment are described in comparison with a semiconductor device 1R according to a comparative example. This comparative example differs from the present embodiment in a method of changing the amplitudes of the signals SP and SN.

FIG. 6 illustrates a configuration example of a transmission unit 20R in the semiconductor device 1R. The transmission unit 20R includes a driver DRVR, regulators REGH and REGL, and an output controller 24R.

The driver DRVR is configured to generate the signals SP and SN on the basis of the signal S21. The driver DRVR operates on the basis of a power supply voltage VDD2 at a power supply node NVDD2 and a power supply voltage VSS2 at a power supply node NVSS2. The driver DRVR includes transistors MP31, MN31, MP32, and MN32 and resistors RP and RN. The transistors MP31 and MP32 are P-type MOS transistors, and the transistors MN31 and MN32 are N-type MOS transistors.

The transistor MP31 has a gate coupled to a gate of the transistor MN31 and coupled to the drains of the transistors MP01 and MN01 of the buffer circuit 21, a source coupled to the power supply node NVDD2, and a drain coupled to a drain of the transistor MN31 and one end of the resistor RP. The transistor MN31 has the gate coupled to the gate of the transistor MP31 and coupled to the drains of the transistors MP01 and MN01 of the buffer circuit 21, the drain coupled to the drain of the transistor MP31 and the one end of the resistor RP, and a source coupled to the power supply node NVSS2. The transistor MP32 has a gate coupled to a gate of the transistor MN32 and coupled to the drains of the transistors MP02 and MN02 of the buffer circuit 21, a source coupled to the power supply node NVDD2, and a drain coupled to a drain of the transistor MN32 and one end of the resistor RN. The transistor MN32 has the gate coupled to the gate of the transistor MP32 and coupled to the drains of the transistors MP02 and MN02 of the buffer circuit 21, the drain coupled to the drain of the transistor MP32 and the one end of the resistor RN, and a source coupled to the power supply node NVSS2.

The resistor RP has the one end coupled to the drains of the transistors MP31 and MN31 and another end coupled to the output terminal OUTP of the semiconductor device 1R. In this example, a resistance value of the resistor RP is set in such a manner that in a case where the transistor MP31 is in the on state, the sum of an on-resistance value of the transistor MP31 and the resistance value of the resistor RP is 50Ω, and in a case where the transistor MN31 is in the on state, the sum of an on-resistance value of the transistor MN31 and the resistance value of the resistor RP is 50Ω.

The resistor RN has the one end coupled to the drains of the transistors MP32 and MN32 and another end coupled to the output terminal OUTN of the semiconductor device 1R. In this example, a resistance value of the resistor RN is set in such a manner that in a case where the transistor MP32 is in the on state, the sum of an on-resistance value of the transistor MP32 and the resistance value of the resistor RN is 50Ω, and in a case where the transistor MN32 is in the on state, the sum of an on-resistance value of the transistor MN32 and the resistance value of the resistor RN is 50Ω.

The regulator REGH is configured to generate, on the basis of a voltage VH, the power supply voltage VDD2 at the power supply node NVDD2. An amplifier included in the regulator REGH has a positive input terminal to be supplied with the voltage VH by the output controller 24R, and the amplifier has a negative input terminal and an output terminal coupled to the power supply node NVDD2. The regulator REGH operates on the basis of the power supply voltage VDD at the power supply node NVDD and the ground voltage VSS at the ground node NVSS.

The regulator REGL is configured to generate, on the basis of a voltage VL, the power supply voltage VSS2 at the power supply node NVSS2. An amplifier included in the regulator REG has a positive input terminal to be supplied with the voltage VL by the output controller 24R, and the amplifier has a negative input terminal and an output terminal coupled to the power supply node NVSS2. The regulator REGL operates on the basis of the power supply voltage VDD at the power supply node NVDD and the ground voltage VSS at the ground node NVSS.

The output controller 24R is configured to adjust the amplitudes of the signals SP and SN by setting the voltages VH and VL. Specifically, the output controller 24R is able to make the amplitudes of the signals SP and SN larger by making a difference between the voltage VH and the voltage VL larger, and make the amplitudes of the signals SP and SN smaller by making the difference between the voltage VH and the voltage VL smaller.

In recent years, a power supply voltage has become lower with progress of miniaturization in a manufacturing process. In the semiconductor device 1R according to the comparative example, for example, gate-source voltages Vgs of the transistors MN31 and MN32 in the driver DRVR become smaller as the power supply voltage VDD becomes lower. In other words, in the semiconductor device 1R, the power supply voltage VSS2 of the sources of the transistors MN31 and MN32 is higher than the ground voltage VSS; therefore, it is difficult to sufficiently secure the gate-source voltages Vgs of the transistors MN31 and MN32. This results in large on-resistance when the transistors MN31 and MN32 are put into the on state. To make the on-resistance smaller, it is necessary to make, for example, gate widths W of the transistors MN31 and MN32 larger. The same applies to the transistors MP31 and MP32. However, in this case, parasitic capacitance of the transistors MN31, MN32, MP31, and MP32 increases; therefore, for example, rise time and fall time of the signals SP and SN become longer, making it difficult to increase bit rates of the signals SP and SN.

In addition, for example, in a case where the amplitudes of the signals SP and SN are defined by specifications, it is necessary to keep the amplitudes of the signals SP and SN even in a case where the power supply voltage VDD is low. Accordingly, in the semiconductor device 1R, for example, a voltage difference between the power supply voltage VDD at the power supply node NVDD and the power supply voltage VDD2 at the power supply node NVDD2 becomes smaller as the power supply voltage VDD becomes a lower voltage; therefore, it is difficult to make the amplifier in the regulator REGH operate stably while securing sufficient gain.

As described above, it is difficult for the semiconductor device 1R according to the comparative example to operate at the low power supply voltage VDD.

In contrast, in the semiconductor device 1 according to the present embodiment, the two drivers DRVA and DRVB are provided, and the amplitudes of the signals SP and SN is adjusted by reducing the current that flows through the reception unit 91 of the semiconductor device 90. Thus, in the semiconductor device 1, it is possible to omit the regulators REGH and REGL used in the semiconductor device 1R according to the comparative example, which makes it possible to operate at the low power supply voltage VDD.

In addition, in the semiconductor device 1, it is possible to make, for example, the gate-source voltages Vgs of the transistors MN14, MN18, MN24, and MN28 in the drivers DRVA and DRVB larger than in the semiconductor device 1R according to the comparative example. Thus, for example, it is possible to make the gate widths W of the transistors MN14, MN18, MN24, and MN28 smaller, making it possible to make the parasitic capacitance smaller. The same applies to the transistors MP12, MP14, MP22, and MP24. Consequently, even in a case where the power supply voltage VDD is low, it is possible to increase the bit rates of the signals SP and SN.

In addition, it is thus possible to make the gate widths W of the transistors in the drivers DRVA and DRVB smaller; therefore, it is possible to reduce drive power of the buffer circuit 21 that drives the drivers DRVA and DRVB, which makes it possible to reduce the buffer circuit 21 in size. Thus, in the semiconductor device 1, it is possible to reduce the drivers DRVA and DRVB in size and to reduce the buffer circuit 21 in size, which makes it possible to reduce a chip size. In addition, in the semiconductor device 1, it is thus possible to make the parasitic capacitance smaller, making it possible to reduce the drive power; therefore, it is possible to reduce power consumption, making it possible to reduce power supply noise caused by the transmission unit 20R.

As described above, the semiconductor device 1 is provided with the driver DRVA that has the output terminal OPA coupled to the output terminal OUTP and the output terminal ONA coupled to the output terminal OUTN and outputs a differential signal corresponding to the signal S21 from the output terminals OPA and ONA, and the driver DRVB that has the output terminal OPB coupled to the output terminal OUTN and the output terminal ONB coupled to the output terminal OUTP and outputs a differential signal corresponding to the signal S21 from the output terminals OPB and ONB. With this configuration, in the semiconductor device 1, as described above, it is possible to adjust the amplitudes of the signals SP and SN by reducing the current that flows through the reception unit 91 of the semiconductor device 90. Thus, for example, it is possible to make the gate widths W of the transistors in the drivers DRVA and DRVB smaller, making it possible to make the parasitic capacitance smaller, which makes it possible to operate at the low power supply voltage VDD.

[Effects]

As described above, in the present embodiment, the driver DRVA that has the output terminal OPA coupled to the output terminal OUTP and the output terminal ONA coupled to the output terminal OUTN and outputs a differential signal corresponding to the signal S21 from the output terminals OPA and ONA, and the driver DRVB that has the output terminal OPB coupled to the output terminal OUTN and the output terminal ONB coupled to the output terminal OUTP and outputs a differential signal corresponding to the signal S21 from the output terminals OPB and ONB are provided. This makes it possible to operate at a low power supply voltage.

Modification Example 1

In the above embodiment, the driver DRVA includes the plurality of drivers (the drivers DRVA1 to DRVA40) and the driver DRVB includes the plurality of drivers (the drivers DRVB1 to DRVB20), but this is not limitative. Some examples are given below to describe the present modification example in detail.

FIG. 7 illustrates a configuration example of a transmission unit 20A according to the present modification example. In this example, the driver DRVB includes one driver. Each element in the driver DRVB may have an element value the same as or different from an element value of each element in each of the drivers DRVA1 to DRVA40. The output controller 24A is able to adjust output impedance of the transmission unit 20A and able to adjust the amplitudes of the signals SP and SN.

FIG. 8 illustrates a configuration example of another transmission unit 20B according to the present modification example. In this example, the driver DRVA includes one driver. The element value of each element in the driver DRVA is different from the element value of each element in each of the drivers DRVB1 to DRVB20. Specifically, for example, it is desired that the gate widths of the transistors MP12 and MP14 in the driver DRVA be larger than the gate widths of the transistors MP22 and MP24 in each of the drivers DRVB1 to DRVB20. It is desired that the gate widths of the transistors MN14 and MN18 in the driver DRVA be larger than the gate widths of the transistors MN24 and MN28 in each of the drivers DRVB1 to DRVB20. It is desired that the resistance value of the resistors RPA and RNA in the driver DRVA be smaller than the resistance value of RPB and RNB in each of the drivers DRVB1 to DRVB20. The output controller 24B is able to adjust output impedance of the transmission unit 20B and able to adjust the amplitudes of the signals SP and SN.

FIG. 9 illustrates a configuration example of another transmission unit 20C according to the present modification example. In this example, the driver DRVA includes one driver, and the driver DRVB includes one driver. The element value of each element in the driver DRVA is different from the element value of each element in the driver DRVB. Specifically, for example, it is desired that the gate widths of the transistors MP12 and MP14 in the driver DRVA be larger than the gate widths of the transistors MP22 and MP24 in the driver DRVB. It is desired that the gate widths of the transistors MN14 and MN18 in the driver DRVA be larger than the gate widths of the transistors MN24 and MN28 in the driver DRVB. It is desired that the resistance value of the resistors RPA and RNA in the driver DRVA be smaller than the resistance value of RPB and RNB in the driver DRVB. The output controller 24C is able to adjust output impedance of the transmission unit 20C and able to adjust the amplitudes of the signals SP and SN.

Modification Example 2

In the above embodiment, the output controller 24 is provided to make it possible to, after manufacture of the semiconductor device 1, perform the adjustment of the output impedance of the transmission unit 20 and the adjustment of the amplitudes of the signals SP and SN, but this is not limitative. Alternatively, without providing the output controller 24, the adjustment of the output impedance of the transmission unit and the adjustment of the amplitudes of the signals SP and SN may be performed at design time. A semiconductor device 1D according to the present modification example is described in detail below.

FIG. 10 illustrates a configuration example of a transmission unit 20D of the semiconductor device 1D. The transmission unit 20D includes the buffer circuit 21 and the drivers DRVA and DRVB.

The driver DRVA includes one driver. The driver DRVA includes the transistors MP12, MN14, MP14, and MN18. The gates of the transistors MP12 and MN14 are coupled to the drains of the transistors MP01 and MN01 in the buffer circuit 21. The gates of the transistors MP14 and MN18 are coupled to the drains of the transistors MP02 and MN02 in the buffer circuit 21. In other words, the driver DRVA is, for example, the driver DRVA illustrated in FIG. 9 from which the transistors MP11, MP13, MN11 to MN13, and MN15 to MN17 are omitted.

The driver DRVB includes one driver. The driver DRVB includes the transistors MP22, MN24, MP24, and MN28. The gates of the transistors MP22 and MN24 are coupled to the drains of the transistors MP01 and MN01 in the buffer circuit 21. The gates of the transistors MP24 and MN28 are coupled to the drains of the transistors MP02 and MN02 in the buffer circuit 21. In other words, the driver DRVB is, for example, the driver DRVB illustrated in FIG. 9 from which the transistors MP21, MP23, MN21 to MN23, and MN25 to MN27 are omitted.

It is desired that the gate widths of the transistors MP12 and MP14 in the driver DRVA be larger than the gate widths of the transistors MP22 and MP24 in the driver DRVB. It is desired that the gate widths of the transistors MN14 and MN18 in the driver DRVA be larger than the gate widths of the transistors MN24 and MN28 in the driver DRVB. It is desired that the resistance value of the resistors RPA and RNA in the driver DRVA be smaller than the resistance value of RPB and RNB in the driver DRVB. The semiconductor device 1D is designed in such a manner that output impedance of the transmission unit 20D is a desired value (50Ω in this example) and the amplitudes of the signals SP and SN are desired amplitudes. Such a semiconductor device 1D is applicable, for example, in a case where characteristics vary due to process variation in a manufacturing process of the semiconductor device 1D, to an application in which the variation is allowable.

Modification Example 3

In the above embodiment, the output controller 24 sets one or a plurality of drivers to be operated out of the drivers DRVA1 to DRVA40 by controlling the operation of the transistors MP11, MN11 to MN13, MP13, and MN15 to MN17 in each of the drivers DRVA1 to DRVA40, but this is not limitative. Alternatively, for example, one or a plurality of drivers to be operated out of the drivers DRVA1 to DRVA40 may be set by controlling supply of the power supply voltage to each of the drivers DRVA1 to DRVA40. The same applies to the driver DRVB.

Modification Example 4

In the above embodiment, in each of the drivers DRVA1 to DRVA40, the resistor RPA is provided between the drains of the transistors MP12 and MN14 and the output terminal OPA, and the resistor RNA is provided between the drains of the transistor MP14 and MN18 and the output terminal ONA. Further, in each of the drivers DRVB1 to DRVB20, the resistor RPB is provided between the drains of the transistors MP22 and MN24 and the output terminal OPB, and the resistor RNB is provided between the drains of the transistors MP24 and MN28 and the output terminal ONB. However, this is not limitative. Some examples are given below to describe the present modification example in detail.

FIGS. 11 to 13 each illustrate an example of the driver DRVA1 according to the present modification example. The same applies to the drivers DRVA2 to DRVA40 and DRVB1 to DRVB20. It is to be noted that, for convenience of description, FIGS. 11 to 13 omit illustration of the transistors MP11, MN11 to MN13, MP13, and MN15 to MN17.

For example, the driver DRVA1 illustrated in FIG. 11 includes four resistors RPA1, RPA2, RNA1, and RNA2. The resistor RPA1 has one end coupled to the drain of the transistor MP12 and another end coupled to the output terminal OPA. The resistor RPA2 has one end coupled to the output terminal OPA and another end coupled to the drain of the transistor MN14. The resistor RNA1 has one end coupled to the drain of the transistor MP14 and another end coupled to the output terminal ONA. The resistor RNA2 has one end coupled to the output terminal ONA and another end coupled to the drain of the transistor MN18. Here, the resistor RPA1 corresponds to a specific example of a "third resistor" in the present disclosure. The resistor RPA2 corresponds to a specific example of a "fourth resistor" in the present disclosure. The resistor RNA1 corresponds to a specific example of a "fifth resistor" in the present disclosure. The resistor RNA2 corresponds to a specific example of a "sixth resistor" in the present disclosure.

For example, the driver DRVA1 illustrated in FIG. 12 includes four resistors RPA3, RPA4, RNA3, and RNA4. The resistor RPA3 has one end coupled to the power supply node NVDD and another end coupled to the source of the transistor MP12. The resistor RPA4 has one end coupled to the source of the transistor MN14 and another end coupled to the ground node NVSS. The resistor RNA3 has one end coupled to the power supply node NVDD and another end coupled to the source of the transistor MP14. The resistor RNA4 has one end coupled to the source of the transistor MN18 and another end coupled to the ground node NVSS. Here, the resistor RPA3 corresponds to a specific example of the "third resistor" in the present disclosure. The resistor RPA4 corresponds to a specific example of the "fourth resistor" in the present disclosure. The resistor RNA3 corresponds to a specific example of the "fifth resistor" in the present disclosure. The resistor RNA4 corresponds to a specific example of the "sixth resistor" in the present disclosure.

For example, the driver DRVA1 illustrated in FIG. 13 includes four resistors RPA5 to RPA7 and RNA5 to RNA7. The resistor RPA5 has one end coupled to the power supply node NVDD and another end coupled to the source of the transistor MP12. The resistor RPA6 has one end coupled to the source of the transistor MN14 and another end coupled to the ground node NVSS. The resistor RPA7 has one end coupled to the drains of the transistors MP12 and MN14 and another end coupled to the output terminal OPA. The resistor RNA5 has one end coupled to the power supply node NVDD and another end coupled to the source of the transistor MP14. The resistor RNA6 has one end coupled to the source of the transistor MN18 and another end coupled to the ground node NVSS. The resistor RNA7 has one end coupled to the drains of the transistors MP14 and MN18 and another end coupled to the output terminal ONA. Here, the resistor RPA5 corresponds to a specific example of the "third resistor" in the present disclosure. The resistor RPA6 corresponds to a specific example of the "fourth resistor" in the present disclosure. The resistor RPA7 corresponds to a specific example of the "first resistor" in the present disclosure. The resistor RNA5 corresponds to a specific example of the "fifth resistor" in the present disclosure. The resistor RNA6 corresponds to a specific example of the "sixth resistor" in the present disclosure. The resistor RNA7 corresponds to a specific example of the "second resistor" in the present disclosure.

Modification Example 5

In the above embodiment, each of the drivers DRVA1 to DRVA40 and DRVB1 to DRVB20 is configured by using both P-type MOS transistors and N-type MOS transistors, but this is not limitative. Alternatively, for example, each of the drivers DRVA1 to DRVA40 and DRVB1 to DRVB20 may be configured by using either P-type MOS transistors or N-type MOS transistors. Some examples are given below to describe the present modification example in detail.

FIGS. 14 and 15 each illustrate an example of the driver DRVA1 according to the present modification example. The same applies to the drivers DRVA2 to DRVA40 and DRVB1 to DRVB20.

The driver DRVA1 illustrated in FIG. 14 includes four transistors MN41 to MN44. The transistor MN41 has a gate coupled to a gate of the transistor MN44 and coupled to the buffer circuit 21, a drain coupled to the power supply node NVDD, and a source coupled to a drain of the transistor MN42 and one end of the resistor RPA. The transistor MN42 has a gate coupled to a gate of the transistor MN43 and coupled to the buffer circuit 21, the drain coupled to the source of the transistor MN41 and the one end of the resistor RPA, and a source coupled to the ground node NVSS. The transistor MN43 has the gate coupled to the gate of the transistor MN42 and coupled to the buffer circuit 21, a drain coupled to the power supply node NVDD, and a source coupled to a drain of the transistor MN44 and one end of the resistor RNA. The transistor MN44 has the gate coupled to the gate of the transistor MN41 and coupled to the buffer circuit 21, the drain coupled to the source of the transistor MN43 and the one end of the resistor RNA, and a source coupled to the ground node NVSS. Here, the transistor MN41 corresponds to a specific example of the "first transistor" in the present disclosure. The transistor MN42 corresponds to a specific example of the "second transistor" in the present disclosure. The transistor MN43 corresponds to a specific example of the "third transistor" in the present disclosure. The transistor MN44 corresponds to a specific example of the "fourth transistor" in the present disclosure.

The driver DRVA1 illustrated in FIG. 15 includes four transistors MP41 to MP44. The transistor MP41 has a gate coupled to a gate of the transistor MP44 and coupled to the buffer circuit 21, a source coupled to the power supply node NVDD, and a drain coupled to a source of the transistor MP42 and one end of the resistor RPA. The transistor MP42 has a gate coupled to a gate of the transistor MP43 and coupled to the buffer circuit 21, the source coupled to the drain of the transistor MP41 and the one end of the resistor RPA, and a drain coupled to the ground node NVSS. The transistor MP43 has the gate coupled to the gate of the transistor MP42 and coupled to the buffer circuit 21, a source coupled to the power supply node NVDD, and a drain coupled to a source of the transistor MP44 and one end of the resistor RNA. The transistor MP44 has the gate coupled to the gate of the transistor MP41 and coupled to the buffer circuit 21, the source coupled to the drain of the transistor MP43 and the one end of the resistor RNA, and a drain coupled to the ground node NVSS. Here, the transistor MP41 corresponds to a specific example of the "first transistor" in the present disclosure. The transistor MP42 corresponds to a specific example of the "second transistor" in the present disclosure. The transistor MP43 corresponds to a specific example of the "third transistor" in the present disclosure. The transistor MP44 corresponds to a specific example of the "fourth transistor" in the present disclosure Modification Example 6

In the above embodiment, a regulator is not provided, but this is not limitative. Some examples are given below to describe the present modification example in detail.

FIG. 16 illustrates a configuration example of a transmission unit 20E according to the present modification example. The transmission unit 20E includes a regulator REG1 and an output controller 24E.

The regulator REG1 is configured to generate, on the basis of the voltage VH, the power supply voltage VDD2 at the power supply node NVDD2. An amplifier included in the regulator REG1 has a positive input terminal to be supplied with the voltage VH by the output controller 24E, and the amplifier has a negative input terminal and an output terminal coupled to the power supply node NVDD2. The regulator REG1 operates on the basis of the power supply voltage VDD at the power supply node NVDD and the ground voltage VSS at the ground node NVSS.

In this example, the buffer circuit 21 and the drivers DRVA and DRVB operate on the basis of the power supply voltage VDD2 at the power supply node NVDD2 and the ground voltage VSS at the ground node NVSS.

The output controller 24E is configured to adjust output impedance of the transmission unit 20E and adjust the amplitudes of the signals SP and SN. In addition, the output controller 24E also has a function of generating the voltage VH. The voltage VH may be, for example, a fixed voltage or a variable voltage.

In the transmission unit 20E, thus providing the regulator REG1 makes it possible to, for example, suppress influence of power supply noise caused by the transmission unit 20E on a circuit other than the transmission unit 20E in the semiconductor device. In addition, in the transmission unit 20E, for example, it is possible to suppress influence of power supply noise included in the power supply voltage VDD on the transmission unit 20E.

It is to be noted that, in this example, the regulator REG1 supplies the generated power supply voltage VDD2 to the buffer circuit 21 and the drivers DRVA and DRVB, but this is not limitative. Alternatively, for example, as in a transmission unit 20F illustrated in FIG. 17, the generated power supply voltage VDD2 may be supplied to the drivers DRVA and DRVB. In this example, the buffer circuit 21 operates on the basis of the power supply voltage VDD at the power supply node NVDD and the ground voltage VSS at the ground node NVSS.

FIG. 18 illustrates a configuration example of another transmission unit 20G according to the present modification example. The transmission unit 20G includes a regulator REG2 and an output controller 24G.

The regulator REG2 is configured to generate, on the basis of the voltage VL, the power supply voltage VSS2 at the power supply node NVSS2. An amplifier included in the regulator REG2 has a positive input terminal to be supplied with the voltage VL by the output controller 24G, and the amplifier has a negative input terminal and an output terminal coupled to the power supply node NVSS2. The regulator REG2 operates on the basis of the power supply voltage VDD at the power supply node NVDD and the ground voltage VSS at the ground node NVSS.

In this example, the buffer circuit 21 operates on the basis of the power supply voltage VDD at the power supply node NVDD and the ground voltage VSS at the ground node NVSS. The drivers DRVA and DRVB operate on the basis of the power supply voltage VDD at the power supply node NVDD and the power supply voltage VSS2 at the power supply node NVSS2.

The output controller 24G is configured to adjust output impedance of the transmission unit 20G and adjust the amplitudes of the signals SP and SN. In addition, the output controller 24G also has a function of generating the voltage VL. The voltage VL may be, for example, a fixed voltage or a variable voltage.

In addition, the transmission unit 20E (FIG. 16) and the transmission unit 20G (FIG. 18) according to the present modification example may be combined, or the transmission unit 20F (FIG. 17) and the transmission unit 20G (FIG. 18) according to the present modification example may be combined. FIG. 19 illustrates a configuration example of a transmission unit 20H in which the transmission unit 20F (FIG. 17) and the transmission unit 20G (FIG. 18) are combined. The transmission unit 20H includes the regulators REG1 and REG2 and an output controller 24H. In this example, the buffer circuit 21 operates on the basis of the power supply voltage VDD at the power supply node NVDD and the ground voltage VSS at the ground node NVSS. The drivers DRVA and DRVB operate on the basis of the power supply voltage VDD2 at the power supply node NVDD2 and the power supply voltage VSS2 at the power supply node NVSS2.

Modification Example 7

In the above embodiment, the buffer circuit 21 and the drivers DRVA and DRVB are coupled to the one power supply node NVDD, but this is not limitative. Alternatively, for example, as in a transmission unit 20I illustrated in FIG. 20, the buffer circuit 21 may be coupled to a power supply node NVDD3, and the drivers DRVA and DRVB may be coupled to the power supply node NVDD. The power supply node NVDD3 and the power supply node NVDD are supplied with power supply voltages from the outside of the semiconductor device. The power supply voltage at the power supply node NVDD3 and the power supply voltage at the power supply node NVDD may be equal to each other or different from each other.

In addition, for example, as in a transmission unit 20J illustrated in FIG. 21, a filter F may be provided between the power supply node NVDD3 and the power supply node NVDD. The filter F includes an inductor L1 and a resistor RE The inductor L1 has one end coupled to the power supply node NVDD3 and another end coupled to the power supply node NVDD. The resistor R1 has one end coupled to the power supply node NVDD3 and another end coupled to the power supply node NVDD. In other words, the inductor L1 and the resistor R1 are coupled in parallel to each other. In this example, the power supply voltage at the power supply node NVDD3 and the power supply voltage at the power supply node NVDD are equal to each other. In the transmission unit 20J, providing such a filter F makes it possible to, for example, suppress influence of power supply noise caused by the drivers DRVA and DRVB on a circuit other than the drivers DRVA and DRVB in the semiconductor device. In addition, in the transmission unit 20J, for example, it is possible to suppress influence of power supply noise included in the power supply voltage VDD3 on the drivers DRVA and DRVB.

Other Modification Examples

In addition, two or more of these modification examples may be combined with each other.

Although the present technology has been described with reference to the embodiment and modification examples, the present technology is not limited to these embodiment, etc., and various modifications may be made.

For example, the resistance values of the resistors RPA, RNA, RPB, and RNB, the number of drivers in the driver DRVA, the number of drivers in the driver DRVB, and the like in the above embodiments, etc. are examples, and may be changed as appropriate.

It is to be noted that the effects described in the present specification are merely illustrative and non-limiting, and other effects may be provided.

It is to be noted that the present technology may be configured as below. According to the present technology having the following configurations, it is possible to operate at a low power supply voltage.

(1)
A semiconductor device including:
a first output terminal and a second output terminal;
a first driver that has a first positive terminal coupled to the first output terminal and a first negative terminal coupled to the second output terminal, and outputs a differential signal corresponding to a first signal from the first positive terminal and the first negative terminal; and
a second driver that has a second positive terminal coupled to the second output terminal and a second negative terminal coupled to the first output terminal, and outputs a differential signal corresponding to the first signal from the second positive terminal and the second negative terminal.

(2)
The semiconductor device according to (1), in which
currents in directions opposite to each other flow through the first positive terminal and the second negative terminal, and
currents in directions opposite to each other flow through the first negative terminal and the second positive terminal.

(3)
The semiconductor device according to (1) or (2), including
a plurality of the first drivers;
a plurality of the second drivers; and
a controller that sets the number of the first drivers to be operated out of the plurality of first drivers and the number of the second drivers to be operated out of the plurality of second drivers.

(4)
The semiconductor device according to (3), in which a circuit configuration of the first driver is same as a circuit configuration of the second driver.

(5)
The semiconductor device according to (4), in which the controller sets the number of the first drivers to be operated and the number of the second drivers to be operated to make a sum of the number of the first drivers to be operated and the number of the second drivers to be operated constant.

(6)
The semiconductor device according to (1) or (2), including:
a plurality of the first drivers; and
a controller that sets the number of the first drivers to be operated out of the plurality of first drivers.

(7)
The semiconductor device according to (1) or (2), including:
a plurality of the second drivers; and
a controller that sets the number of the second drivers to be operated out of the plurality of second drivers.

(8)
The semiconductor device according to any one of (1) to (7), in which
the first driver includes
a first transistor provided in a first path coupling a first power supply node and the first positive terminal,
a second transistor provided in a second path coupling a second power supply node and the first positive terminal,
a third transistor provided in a third path coupling the first power supply node and the first negative terminal, and
a fourth transistor provided in a fourth path coupling the second power supply node and the first negative terminal, and
the second driver includes
a fifth transistor provided in a fifth path coupling the first power supply node and the second positive terminal, a sixth transistor provided in a sixth path coupling the second power supply node and the second positive terminal, a seventh transistor provided in a seventh path coupling the first power supply node and the second negative terminal, and an eighth transistor provided in an eighth path coupling the second power supply node and the second negative terminal.

(9)
The semiconductor device according to (8), in which the first driver further includes a first resistor provided in a first partial path overlapping between the first path and the second path, and a second resistor provided in a second partial path overlapping between the third path and the third path.

(10)
The semiconductor device according to (8) or (9), in which the first driver further includes a third resistor provided in the first path, a fourth resistor provided in the second path, a fifth resistor provided in the third path, and a sixth resistor provided in the fourth path.

(11)
The semiconductor device according to any one of (8) to (10), in which the first transistor and the second transistor include transistors of a first conductivity type, and the third transistor and the fourth transistor include transistors of a second conductivity type.

(12)
The semiconductor device according to any one of (8) to (10), in which the first transistor, the second transistor, the third transistor, and the fourth transistor include transistors of a same conductivity type as each other.

(13)
The semiconductor device according to any one of (8) to (12), further including a buffer circuit that operates on the basis of a first power supply voltage supplied via the first power supply node and a second power supply voltage supplied via the second power supply node, and generates the first signal on the basis of a second signal.

(14)
The semiconductor device according to (13), further including a regulator that operates on the basis of a third power supply voltage supplied via a third power supply node, and generates the first power supply voltage.

(15)
The semiconductor device according to any one of (8) to (12), further including a buffer circuit that operates on the basis of a third power supply voltage supplied via a third power supply node and a second power supply voltage supplied via the second power supply node, and generates the first signal on the basis of a second signal.

(16)
The semiconductor device according to (15), further including a regulator that operates on the basis of the third power supply voltage supplied via the third power supply node, and generates a first power supply voltage at the first power supply node.

(17)
The semiconductor device according to (15), further including a filter circuit provided between the first power supply node and the third power supply node.

(18)
The semiconductor device according to any one of (8) to (12), further including:

a buffer circuit that operates on the basis of a third power supply voltage supplied via a third power supply node and a fourth power supply voltage supplied via a fourth power supply node, and generates the first signal on the basis of a second signal;

a first regulator that operates on the basis of the third power supply voltage supplied via the third power supply node, and generates a first power supply voltage at the first power supply node; and a second regulator that operates on the basis of the fourth power supply voltage supplied via the fourth power supply node, and generates a second power supply voltage at the second power supply node.

This application claims the benefit of Japanese Priority Patent Application No. 2020-078686 filed with the Japan Patent Office on Apr. 27, 2020, the entire contents of each of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor device, comprising:
a first output terminal and a second output terminal;
a plurality of first drivers, wherein
each of the plurality of first drivers includes:
a first positive terminal coupled to the first output terminal; and
a first negative terminal coupled to the second output terminal,
at least one driver of the plurality of first drivers is configured to output a first differential signal from the first positive terminal and the first negative terminal, and
the first differential signal corresponds to a first signal;
a plurality of second drivers, wherein
each of the plurality of second drivers includes:
a second positive terminal coupled to the second output terminal;
a second negative terminal coupled to the first output terminal,
at least one driver of the plurality of second drivers is configured to output a second differential signal from the second positive terminal and the second negative terminal, and
the second differential signal corresponds to the first signal; and
a controller configured to set a first number of drivers to be operated out of the plurality of first drivers and a second number of drivers to be operated out of the plurality of second drivers.

2. The semiconductor device according to claim 1, wherein
a first current flows in a first direction through the first positive terminal,
a second current flows in a second direction through the second negative terminal,
the first direction is opposite to the second direction,
a third current flows in the second direction through the first negative terminal, and
a fourth current flows in the first direction through the second positive terminal.

3. The semiconductor device according to claim 1, wherein a circuit configuration of each driver of the plurality of first drivers is same as a circuit configuration of each driver of the plurality of second drivers.

4. The semiconductor device according to claim 3, wherein the controller is further configured to set the first number of drivers and the second number of drivers to make a sum of the first number of drivers and the second number of drivers constant.

5. The semiconductor device according to claim 1, wherein
the at least one driver of the plurality of first drivers includes:
a first transistor in a first path that couples a first power supply node and the first positive terminal,
a second transistor in a second path that couples a second power supply node and the first positive terminal,
a third transistor in a third path that couples the first power supply node and the first negative terminal, and
a fourth transistor in a fourth path that couples the second power supply node and the first negative terminal, and
at least one driver of the plurality of second drivers includes:
a fifth transistor in a fifth path that couples the first power supply node and the second positive terminal,
a sixth transistor in a sixth path that couples the second power supply node and the second positive terminal,
a seventh transistor in a seventh path that couples the first power supply node and the second negative terminal, and
an eighth transistor in an eighth path that couples the second power supply node and the second negative terminal.

6. The semiconductor device according to claim 5, wherein the at least one driver of the plurality of first drivers further includes:
a first resistor in a first partial path overlapping between the first path and the second path, and
a second resistor provided in a second partial path overlapping between the third path and the fourth path.

7. The semiconductor device according to claim 5, wherein the at least one driver of the plurality of first driver further includes;
a third resistor in the first path,
a fourth resistor in the second path,
a fifth resistor in the third path, and
a sixth resistor in the fourth path.

8. The semiconductor device according to claim 5, wherein
the first transistor and the second transistor comprise transistors of a first conductivity type, and
the third transistor and the fourth transistor comprise transistors of a second conductivity type.

9. The semiconductor device according to claim 5, wherein the first transistor, the second transistor, the third transistor, and the fourth transistor comprise transistors of a same conductivity type.

10. The semiconductor device according to claim 5, further comprising a buffer circuit configured to be operated based on a first power supply voltage supplied via the first power supply node and a second power supply voltage supplied via the second power supply node, wherein the buffer circuit is further configured to generate the first signal based on a basis of a second signal.

11. The semiconductor device according to claim 10, further comprising a regulator configured to be operated based on a third power supply voltage supplied via a third power supply node, wherein the regulator is further configured to generate the first power supply voltage.

12. The semiconductor device according to claim 5, further comprising a buffer circuit configured to be operated based on a third power supply voltage supplied via a third power supply node and a second power supply voltage supplied via the second power supply node, wherein the buffer circuit is further configured to generate the first signal based on a second signal.

13. The semiconductor device according to claim 12, further comprising a regulator configured to be operated based on the third power supply voltage supplied via the third power supply node, and wherein the regulator is further configured to generate a first power supply voltage at the first power supply node.

14. The semiconductor device according to claim 12, further comprising a filter circuit between the first power supply node and the third power supply node.

15. The semiconductor device according to claim 5, further comprising:
a buffer circuit configured to be operated based on a third power supply voltage supplied via a third power supply node and a fourth power supply voltage supplied via a fourth power supply node, wherein the buffer circuit is further configured to generate the first signal based on a second signal;
a first regulator configured to be operated based on the third power supply voltage supplied via the third power supply node, wherein the first regulator is further configured to generate a first power supply voltage at the first power supply node; and
a second regulator configured to be operated based on the fourth power supply voltage supplied via the fourth power supply node, wherein the second regulator is further configured to generate a second power supply voltage at the second power supply node.

16. A semiconductor device, comprising:
a first output terminal and a second output terminal;
a plurality of first drivers, wherein
each of the plurality of first drivers includes:
a first positive terminal coupled to the first output terminal; and
a first negative terminal coupled to the second output terminal,
at least one driver of the plurality of first drivers is configured to output a first differential signal from the first positive terminal and the first negative terminal, and
the first differential signal corresponds to a specific signal;
a second driver that includes:
a second positive terminal coupled to the second output terminal;
a second negative terminal coupled to the first output terminal, wherein
the second driver is configured to output a second differential signal from the second positive terminal and the second negative terminal, and
the second differential signal corresponds to the specific signal; and
a controller configured to set a specific number of drivers to be operated out of the plurality of first drivers.

* * * * *